US008476444B2

(12) United States Patent
Katayama et al.

(10) Patent No.: US 8,476,444 B2
(45) Date of Patent: Jul. 2, 2013

(54) BASE GENERATOR

(75) Inventors: Mami Katayama, Tokyo-to (JP); Shunji Fukuda, Tokyo-to (JP); Katsuya Sakayori, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 171 days.

(21) Appl. No.: 12/935,112

(22) PCT Filed: Mar. 30, 2009

(86) PCT No.: PCT/JP2009/056511
§ 371 (c)(1),
(2), (4) Date: Dec. 13, 2010

(87) PCT Pub. No.: WO2009/123122
PCT Pub. Date: Oct. 8, 2009

(65) Prior Publication Data
US 2011/0086311 A1    Apr. 14, 2011

(30) Foreign Application Priority Data

Mar. 31, 2008  (JP) ................. 2008-093164
Sep. 30, 2008  (JP) ................. 2008-252897
Sep. 30, 2008  (JP) ................. 2008-252905
Mar. 11, 2009  (JP) ................. 2009-058485

(51) Int. Cl.
*C07D 213/72*    (2006.01)
*C07D 213/75*    (2006.01)
*C07D 211/06*    (2006.01)

(52) U.S. Cl.
USPC ......................................... 546/226; 546/305

(58) Field of Classification Search
USPC .................................................. 546/226, 305
See application file for complete search history.

(56) References Cited

U.S. PATENT DOCUMENTS

| 4,093,461 A | 6/1978 | Loprest et al. |
| 7,070,626 B2 * | 7/2006 | Chassot et al. ................... 8/405 |

FOREIGN PATENT DOCUMENTS

| JP | 52-013315 A |   | 2/1977 |
| JP | 54-145794 A |   | 11/1979 |
| JP | 08-227154 A |   | 9/1996 |
| JP | 2000235246 A | * | 8/2000 |
| JP | 2000-321757 A |   | 11/2000 |
| JP | 2003-212856 A |   | 7/2003 |
| JP | 2004-513217 A |   | 4/2004 |
| JP | 2005-017354 A |   | 1/2005 |
| JP | 2005-115361 A |   | 4/2005 |
| JP | 2006-189591 A |   | 7/2006 |
| JP | 2009-080452 A |   | 4/2009 |
| WO | 02/38120 A1 |   | 5/2002 |

OTHER PUBLICATIONS

Machine translation of JP 2000-235246 (no date).*

(Continued)

*Primary Examiner* — Amanda C. Walke
(74) *Attorney, Agent, or Firm* — Ladas & Parry LLP

(57) ABSTRACT

A photosensitive resin composition which is excellent in resolution, low in cost, and usable in a wide range of structures of polymer precursors each of which is reacted into a final product by a basic substance or by heating in the presence of a basic substance. The photosensitive resin composition includes a base generator which has a specific structure and generates a base by exposure to electromagnetic radiation and heating, and a polymer precursor which is reacted into a final product by the base generator and by a basic substance or by heating in the presence of a basic substance.

5 Claims, 1 Drawing Sheet

OTHER PUBLICATIONS

Matsuhira et al, "Novel Photosystem Involving Protonation and Deprotonation Processes Modelled on a PYP Photocylce", Royal Society of Chemistry Journal, 6(17), 3118-3126 (2008).*

Koji Arimitsu, et al; "Photobase generation without decarboxylation and its application to photoreactive materials", Polymer Preprints, Japan 2007, vol. 56, No. 2, p. 4263, No Exact Date Given.

International Search Report: PCT/JP2009/056511.

Binghe Wang, et al; "A Photo-Sensitive Protecting Group for Amines Based on Coumarin Chemistry", Chem. Pharm. Bull. 45(4), pp. 715-718, Apr. 1997.

Koji Arimistu, et al; "Formation of Network Polymers Using Photobase Generators Based on Photocyclization", Polymer Preprints, Japan vol. 57, No. 2, (2008), pp. 5377-5378.

* cited by examiner

BASE GENERATOR

TECHNICAL FIELD

The present invention relates to a base generator which generates a base by exposure to electromagnetic radiation and heating, and a photosensitive resin composition comprising the base generator. In particular, the present invention relates to the following: a photosensitive resin composition which can be suitably used as a material for a product or component that is formed by a patterning process using electromagnetic radiation or by a curing acceleration process; a pattern forming material comprising the photosensitive resin composition; a pattern forming method; and an article comprising the resin composition.

BACKGROUND ART

A photosensitive resin composition is used as a material for forming electronic components, optical products or optical elements, a material for forming layers, an adhesive, etc. Especially, it is suitably used as a material for products or components that are formed through a patterning process using electromagnetic radiation.

For example, a polyimide is a polymer material and its properties such as heat resistance, dimensional stability and insulation property are top-ranking in organic materials. Thus, it is widely used as an insulation material for electronic components, etc., and it is increasingly and actively used as a chip coating film of semiconductor elements, a substrate of flexible printed-wiring boards, and so on.

Also in recent years, to solve a problem with polyimide, intense investigations have been carried out into polybenzoxazole having a low water absorption property and a low dielectric constant, polybenzimidazole having excellent adhesion to a substrate, and the like, which can be processed in a similar manner to polyimide.

In general, polyimide has poor solubility in solvents and is difficult to process. As the method for patterning polyimide into a desired shape, therefore, there is a method for obtaining a pattern of polyimide by performing patterning by exposure to light and development when it is in the form of polyimide precursor that has excellent solubility in solvents, and then imidizing the same by heating, etc.

Various methods are proposed for forming a pattern by using a polyimide precursor. Two typical examples thereof are as follows:

(1) A pattern forming method in which, when a polyimide precursor has no ability to form a pattern, a photosensitive resin is provided on a polyimide precursor in the form of resist layer.

(2) A pattern forming method in which a photosensitive site is bonded to or coordinated with a polyimide precursor and a pattern is formed by its action. Alternatively, a pattern forming method in which a polyimide precursor is mixed with a photosensitive component to produce a resin composition, and a pattern is formed by the action of the photosensitive component.

Typical patterning methods using (2) include: (i) a method in which a naphthoquinonediazide derivative that acts as a dissolution inhibitor before exposure to electromagnetic radiation and forms a carboxylic acid to act as a dissolution promoter after the exposure, is mixed with a polyamic acid (polyimide precursor) so that the contrast between the dissolution rate of an exposed region in developers and that of an unexposed region is increased, thereby forming a pattern; thereafter, the pattern is imidized to obtain a polyimide pattern (patent literature 1) and (ii) a method in which a methacryloyl group is introduced into a polyimide precursor via an ester bond or ionic bond and a photoradical generator is added thereto to crosslink exposed regions so that the contrast between the dissolution rate of the exposed region in developers and that of an unexposed region is increased, thereby forming a pattern; thereafter, the pattern is imidized to obtain a polyimide pattern (patent literature 2).

Compared with method (1), method (2) needs no resist layer, so that the process can be significantly simplified. However, method (i) is problematic in that polyimide's characteristic properties are not obtained when the added amount of the naphthoquinonediazide derivative is increased for increasing the dissolution contrast. Method (ii) is problematic in that there is a limitation on the structure of the polyimide precursor.

There is a report of other patterning method (iii) in which a polyamic acid (polyimide precursor) is mixed with a photobase generator, exposed to light and then heated to promote cyclization by the action of bases generated by the exposure and thus to decrease the solubility of the polyimide precursor in developers, so that the contrast between the dissolution rate of the exposed region in developers and that of the unexposed region is increased, thereby forming a pattern; and then the pattern is imidized to obtain a polyimide pattern (patent literature 3).

Other examples of the photosensitive resin composition comprising a photobase generator include a photosensitive resin composition comprising an epoxy compound (for example, patent literature 4). A photobase generator is exposed to light to generate amines in a layer that contains an epoxy compound, so that the amines act as an initiator or catalyst and cure the epoxy compound in the exposed region only, thereby forming a pattern.

Patent Literature 1: Japanese Patent Application Laid-Open (JP-A) No. S52-13315
Patent Literature 2: JP-A No. S54-145794
Patent Literature 3: JP-A No. H08-227154
Patent Literature 4: JP-A No. 2003-212856

SUMMARY OF INVENTION

Technical Problem

A photosensitive resin composition comprising a photobase generator is produced by a simple process because photosensitive polymer precursors can be obtained by simply mixing an existing polymer precursor with a photobase generator at a predetermined ratio. In particular, the photosensitive resin composition comprising the photobase generator provides the benefit of broad utility to polyimide precursors which conventionally have a limitation on the structure of usable precursor compounds because of applicability to polyimide precursors of various structures. However, conventional photobase generators are problematic in that since they have low sensitivity, electromagnetic radiation dose has to be high. Also, they are problematic in that when electromagnetic radiation dose is high, there is a decrease in throughput per unit time.

For example, in the case where a photobase generator is combined with a polyimide precursor, due to a mechanism in which only an exposed region is imidized and becomes insoluble in developers by the catalytic action of bases generated by exposure, if the polyimide precursor is a polyimide precursor that is originally highly soluble in developers, the exposed region also has a high dissolution rate so that there is a limitation in increasing the contrast between the solubility of the exposed region and that of an unexposed region.

As the contrast between the solubility of the exposed region and that of the unexposed region becomes larger, the remaining thickness ratio of a pattern thus obtained after development becomes larger and the shape of the pattern becomes better. However, conventional photosensitive compositions necessitate controlling developer concentration or photobase generator usage and adding a dissolution promoter, resulting in a small process margin.

The present invention has been achieved in light of the these circumstances. A main object of the present invention is to provide a base generator which has excellent sensitivity and can be used in combination with any kind of polymer precursor, and a photosensitive resin composition which has excellent sensitivity, provides a large dissolution contrast between exposed and unexposed regions, and results in formation of a pattern in good shape with keeping a sufficient process margin.

Solution to Problem

The base generator of the present invention is a base generator which is represented by the following chemical formula (1) and generates a base by exposure to electromagnetic radiation and heating:

[Chemical formula 1]

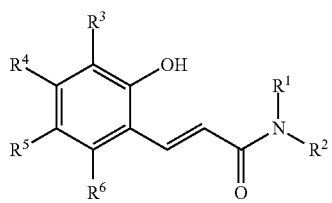

Formula (1)

wherein $R^1$ and $R^2$ are independently hydrogen or a monovalent organic group and may be the same or different; $R^1$ and $R^2$ may be bound to form a cyclic structure which may contain a heteroatom; at least one of $R^1$ and $R^2$ is a monovalent organic group; $R^3$, $R^4$, $R^5$ and $R^6$ are independently hydrogen, halogen, a hydroxyl group, a nitro group, a nitroso group, a mercapto group, a silyl group, a silanol group or a monovalent organic group and may be the same or different; two or more of $R^3$, $R^4$, $R^5$ and $R^6$ may be bound to form a cyclic structure which may contain a heteroatom.

Due to having the above-specified structure, the base generator represented by the chemical formula (1) generates a basic substance when it is subjected to a combination of exposure to electromagnetic radiation and heating, even at a small exposure dose; therefore, the base generator is a base generator which has high sensitivity, can be used in combination with any kind of polymer precursor, and has broad utility.

The photosensitive resin composition of the present invention comprises a polymer precursor which is reacted into a final product by a basic substance or by heating in the presence of a basic substance, and the base generator of the present invention.

In the present invention, the base generator which is represented by the above chemical formula (1) and generates a base by exposure to electromagnetic radiation and heating, is combined with the polymer precursor which is reacted into a final product by a basic substance or by heating in the presence of a basic substance; therefore, the photosensitive resin composition of the present invention has excellent sensitivity, provides a large dissolution contrast between exposed and unexposed regions, and results in formation of a pattern in good shape with keeping a sufficient process margin.

In the present invention, the base generator is preferably such that a base thus generated is a secondary amine which has one NH group that is able to form an amide bond and/or a heterocyclic compound, from the point of view that the base generator becomes highly sensitive and strongly basic, and it provides a large catalytic effect.

In the present invention, the base generator is preferably such that at least one of $R^3$, $R^4$, $R^5$ and $R^6$ is halogen, a hydroxyl group, a nitro group, a nitroso group, a mercapto group, a silyl group, a silanol group or a monovalent organic group, or two or more of $R^3$, $R^4$, $R^5$ and $R^6$ are bound to form a condensed ring together with a benzene ring to which $R^3$, $R^4$, $R^5$ and $R^6$ are bound, from the point of view that the base generator can be adjusted to absorb a desired wavelength or to increase the solubility thereof or the compatibility thereof with the polymer precursor to be combined therewith.

In the present invention, the base generator is preferably such that the base thus generated has a boiling point of 25° C. or more and a weight loss of 80% or more at 350° C. This is because handling is easy at room temperature when the base thus generated has a boiling point of 25° C. or more and it is easy to prevent the base from remaining in a cured polymer when the base thus generated has a weight loss of 80% or more at 350° C.

In the present invention, the base generator is preferably such that the base thus generated has a structure represented by the following formula (2), from the point of view that the base generator is highly sensitive and strongly basic, and it provides a large catalytic effect:

[Chemical formula 2]

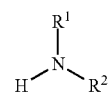

Formula (2)

wherein $R^1$ and $R^2$ are independently a monovalent organic group which is an alkyl group that has 1 to 10 carbon atoms and that may have a substituent, or a cycloalkyl group that has 4 to 12 carbon atoms and that may have a substituent; $R^1$ and $R^2$ may be the same or different; and $R^1$ and $R^2$ may be bound to form a cyclic structure which may contain a heteroatom.

In the present invention, the base generator preferably has absorption at least one of electromagnetic wavelengths of 365 nm, 405 nm and 436 nm, from the point of view that the types of applicable polymer precursors are increased further.

In the photosensitive resin composition of the present invention, preferably used as the polymer precursor is one or more selected from the group consisting of a compound and polymer having an epoxy group, isocyanate group, oxetane group or thiirane group, a polysiloxane precursor, a polyimide precursor and a polybenzoxazole precursor.

In the photosensitive resin composition of the present invention, the polymer precursor is preferably soluble in basic solutions, from the point of view that a large dissolution contrast between the exposed and unexposed regions is obtained.

In an embodiment of the present invention, a polyimide precursor such as polyamic acid or a polybenzoxazole precursor can be used as the polymer precursor of the photosensitive resin composition. The use of such a polymer precursor gives a photosensitive resin composition having excellent physical properties such as heat resistance, dimensional stability and insulation property. The polyimide precursor is preferably a polyamic acid in terms of availability of raw materials.

The present invention also provides a pattern forming material comprising the photosensitive resin composition of the present invention.

The present invention also provides a pattern forming method using the photosensitive resin composition.

The pattern forming method of the present invention is a method for forming a pattern by forming a coating film or molded body with the photosensitive resin composition, exposing the coating film or molded body to electromagnetic radiation in a predetermined pattern, heating the same after or during the exposure to change the solubility of the exposed region, and then developing the coating film or molded body.

In the pattern forming method, a polymer precursor is used in combination with a compound represented by the above formula (1) which acts as the base generator; therefore, it is possible to form a pattern by developing without a resist layer for protecting the surface of the coating film or molded body comprising the photosensitive resin composition.

The present invention also provides an article selected from a printed product, a paint, a sealing agent, an adhesive, a display, a semiconductor device, an electronic component, a microelectromechanical system, a stereolithography product, an optical element and a building material, wherein at least part of which article comprises the photosensitive resin composition or a cured product thereof.

Advantageous Effect of Invention

Because of having the structure represented by the formula (1), the base generator of the present invention generates a base by exposure to electromagnetic radiation and the base generation is promoted by heating; therefore, the base generator is provided with greater sensitivity than conventionally used photobase generators. When used in a photosensitive resin composition, the base generator can be used in combination with any kind of polymer precursor.

The photosensitive resin composition of the present invention is a highly sensitive photosensitive resin composition because the base generator contained and represented by the formula (1) has greater sensitivity than conventionally used photobase generators. When the photosensitive resin composition of the present invention is subjected to exposure to electromagnetic radiation and heating, the solubility of the polymer precursor is changed by the base which is derived from the base generator; moreover, when the base is generated, the base generator loses a phenolic hydroxyl group and thus changes its solubility in basic aqueous solutions. Therefore, it is possible to increase the difference between the solubility of the exposed region and that of the unexposed region further. As a result of obtaining a large dissolution contrast between the exposed and unexposed regions, it is possible to obtain a pattern in good shape with keeping a sufficient process margin.

In addition, unlike acid, the base causes no metal corrosion; therefore, the photosensitive resin composition of the present invention gives a more highly reliable cured film.

When a heating step is included in a pattern forming process, the photosensitive resin composition of the present invention makes it possible to utilize the heating step as a heating for promoting the base generation and is thus advantageous in that the exposure dose of the electromagnetic radiation can be decreased by the utilization of the heating step. Because of this, in comparison with conventional resin compositions which generate a base only by exposure to electromagnetic radiation, the photosensitive resin composition of the present invention realizes process rationalization when it is used in a process that includes such a heating step.

DESCRIPTION OF EMBODIMENTS

Figure 1:
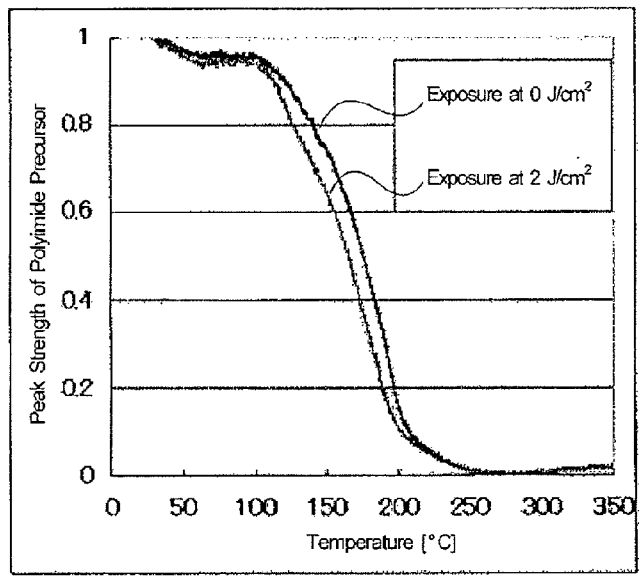
FIG. 1 is a graph showing the relationship between thermal curing temperature of coatings after exposure to ultraviolet radiation and residual amount of a polyimide precursor, the coatings being produced by using photosensitive resin composition (1), and one of the coatings was subjected to whole surface exposure while the other was not subjected to exposure.

Hereinafter, the present invention will be described in detail.

In the present invention, (meth)acryloyl means acryloyl and/or methacryloyl. (Meth)acryl means acryl and/or methacryl. (Meth)acrylate means acrylate and/or methacrylate.

Also in the present invention, except when a specific wavelength is mentioned, electromagnetic radiation includes not only electromagnetic waves having wavelengths in the visible or invisible region but also particle beams such as an electron beam and radiation or ionizing radiation, each of which is a collective term that includes electromagnetic waves and particle beams. In the present description, exposure to electromagnetic radiation is also referred to as exposure to light. Electromagnetic waves having a wavelength of 365 nm, 405 nm and 436 nm may be referred to as i-line, h-line and g-line, respectively.

<Base Generator>

The base generator of the present invention is represented by the following formula (1) and generates a base by exposure to electromagnetic radiation and heating:

[Chemical formula 3]

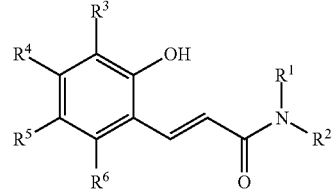

Formula (1)

wherein $R^1$ and $R^2$ are independently hydrogen or a monovalent organic group and may be the same or different; $R^1$ and $R^2$ may be bound to form a cyclic structure which may contain a heteroatom; at least one of $R^1$ and $R^2$ is a monovalent organic group; $R^3$, $R^4$, $R^5$ and $R^6$ are independently hydrogen, halogen, a hydroxyl group, a nitro group, a nitroso group, a mercapto group, a silyl group, a silanol group or a monovalent organic group and may be the same or different; two or more of $R^3$, $R^4$, $R^5$ and $R^6$ may be bound to form a cyclic structure which may contain a heteroatom.

The base generator of the present invention is one kind of photobase generator and generates a base only by exposure to electromagnetic radiation; however, the base generation is promoted by heating appropriately. The base generator of the present invention is able to efficiently generate a base when it is subjected to a combination of exposure to electromagnetic radiation and heating, even at a small exposure dose; moreover, it has higher sensitivity than conventional, so-called photobase generators. A photobase generator is an agent which is not active in a normal condition of an ordinary temperature and pressure but generates a base when it is subjected to exposure to electromagnetic radiation as an external stimulus.

The base generator of the present invention has the above-specified structure; therefore, when it is exposed to electromagnetic radiation, as shown by the following formulae, (—CH=CH—C(=O)—) in the formula (1) is isomerized into a cis isomer and then cyclized by heating to generate a base, (NHR$^1$R$^2$). It is possible by the catalytic action of the base to reduce the temperature at which a polymer precursor starts to react into a final product, or to start a curing reaction to turn a polymer precursor into a final product.

[Chemical formula 4]

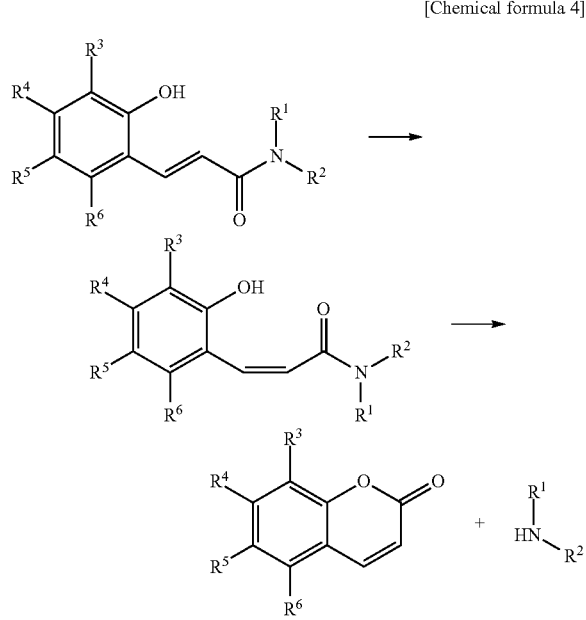

When the base generator represented by the chemical formula (1) is cyclized, it loses a phenolic hydroxyl group to change the solubility thereof. In the case of a basic aqueous solution or the like, the solubility of the base generator is decreased. Because of this, when a polymer precursor contained in the photosensitive resin composition of the present invention is a polyimide precursor or polybenzoxazole precursor, the base generator has a function to further support the solubility decrease that due to the reaction of the precursor into a final product, thereby making it possible to increases the dissolution contrast between exposed and unexposed regions.

R$^1$ and R$^2$ are independently hydrogen or a monovalent organic group and at least one of R$^1$ and R$^2$ is a monovalent organic group. NHR$^1$R$^2$ is a base (in the present invention, "basic substance" is simply referred to as base) and each of R$^1$ and R$^2$ is preferably an organic group containing no amino group. If an amino group is contained in R$^1$ and R$^2$, the base generator itself becomes a basic substance to promote the reaction of the polymer precursor, and the dissolution difference between the exposed and unexposed regions could be small. However, for example, as in the case where an amino group is bound to an aromatic ring that is present in the organic group of R$^1$ and R$^2$, when there is a difference in basicity with a base that is resulted from the exposure to electromagnetic radiation and heating, it is sometimes possible to use the base generator even if an amino group is contained in the organic group of R$^1$ and R$^2$.

As the monovalent organic group, there may be mentioned a saturated or unsaturated alkyl group, a saturated or unsaturated cycloalkyl group, an aryl group, an aralkyl group and a saturated or unsaturated halogenated alkyl group, for example. These organic groups may contain a substituent or a bond other than a hydrocarbon group, such as a heteroatom, and they may be linear or branched.

Also, R$^1$ and R$^2$ may be bound to form a cyclic structure.

The cyclic structure may be a saturated or unsaturated alicyclic hydrocarbon, a heterocyclic ring, a condensed ring, or a structure comprising a combination of two or more selected from the group consisting of the alicyclic hydrocarbon, heterocyclic ring and condensed ring.

The bond other than a hydrocarbon group in the organic group of R$^1$ and R$^2$ is not particularly limited, and there may be mentioned an ether bond, a thioether bond, a carbonyl bond, a thiocarbonyl bond, an ester bond, an amide bond, an urethane bond, an imino bond (—N=C(—R)— or C(=NR)— and R is a hydrogen atom or a monovalent organic group), a carbonate bond and a sulfonyl bond, for example.

The substituent other than a hydrocarbon group in the organic group of R$^1$ and R$^2$ is not particularly limited, and there may be mentioned a halogen atom, a hydroxyl group, a mercapto group, a cyano group, a silyl group, a silanol group, an alkoxy group, an alkoxycarbonyl group, a nitro group, a carboxyl group, an acyl group, an acyloxy group, a sulfino group, a sulfo group, a saturated or unsaturated alkyl ether group, a saturated or unsaturated alkylthioether group, an arylether group, an arylthioether group and an amino group (—NH$_2$, —NHR or —NRR', and R and R' are independently a hydrocarbon group), for example. These groups may be linear, branched or cyclic.

Preferred as the substituent other than a hydrocarbon group in the organic group of R$^1$ and R$^2$ are a halogen atom, a hydroxyl group, a mercapto group, a cyano group, a silyl group, a silanol group, an alkoxy group, an alkoxycarbonyl group, a nitro group, an acyl group, an acyloxy group, a saturated or unsaturated alkyl ether group, a saturated or unsaturated alkylthioether group, an arylether group and an arylthioether group.

The resulting base is NHR$^1$R$^2$, so that it includes a primary amine, a secondary amine or a heterocyclic compound. Each of the amines includes an aliphatic amine and an aromatic amine. The heterocyclic compound herein refers to NHR$^1$R$^2$ that has a cyclic structure and has aromaticity. A nonaromatic heterocyclic compound, which is not an aromatic heterocyclic compound, is considered as an alicyclic amine herein and included in aliphatic amines.

Furthermore, the resulting NHR$^1$R$^2$ may be not only a base which has only one NH group that is capable of forming an amide group, such as a monoamine, but also a base which has two or more NH groups that are capable of forming an amide bond such as a diamine, triamine and tetraamine. When the resulting NHR$^1$R$^2$ is a base having two or more NH groups, there may be mentioned a structure in which a photolatent site is further bound to one or more terminals of R$^1$ and/or R$^2$ in the formula (1), the site being able to generate a base by exposure to electromagnetic radiation and heating, the base having a NH group that is capable of forming an amide bond. As the photolatent site, there may be mentioned a structure in which a residue of the formula (1) which excludes $R^1$ and/or $R^2$ is further bound to one or more terminals of $R^1$ and/or $R^2$ of the formula (1).

As a primary aliphatic amine in the resulting $NHR^1R^2$, there may be mentioned methylamine, ethylamine, propylamine, isopropylamine, n-butylamine, sec-butylamine, tert-butylamine, pentylamine, isoamylamine, tert-pentylamine, cyclopentylamine, hexylamine, cyclohexylamine, heptylamine, cycloheptanamine, octylamine, 2-octanamine, 2,4,4-trimethylpentane-2-amine and cyclooctylamine, for example.

As a primary aromatic amine, there may be mentioned aniline, 2-aminophenol, 3-aminophenol and 4-aminophenol, for example.

As a secondary aliphatic amine, there may be mentioned dimethylamine, diethylamine, dipropylamine, diisopropylamine, dibutylamine, ethylmethylamine, aziridine, azetidine, pyrrolidine, piperidine, azepane, azocane, methylaziridine, dimethylaziridine, methylazetidine, dimethylazetidine, trimethylazetidine, methylpyrrolidine, dimethylpyrrolidine, trimethylpyrrolidine, tetramethylpyrrolidine, methylpiperidine, dimethylpiperidine, trimethylpiperidine, tetramethylpiperidine and pentamethylpiperidine, for example. Among them, preferred is an alicyclic amine.

As a secondary aromatic amine, there may be mentioned methylaniline, diphenylamine and N-phenyl-1-naphthylamine. As an aromatic heterocyclic compound which has one NH group that is capable of forming an amide bond, it is preferable from the viewpoint of basicity that the compound has an imino bond (—N=C(—R)— or —C(=NR)— and R is a hydrogen atom or a monovalent organic group) in a molecule thereof, and there may be mentioned imidazole, purine, triazole and derivatives thereof.

As a base which has two or more NH groups that are capable of forming an amide bond, there may be mentioned a linear aliphatic alkylenediamine such as ethylenediamine, 1,3-propanediamine, 1,4-butanediamine, 1,5-pentanediamine, 1,6-hexanediamine, 1,7-heptanediamine, 1,8-octanediamine, 1,9-nonanediamine and 1,10-decanediamine; a branched aliphatic alkylenediamine such as 1-butyl-1,2-ethanediamine, 1,1-dimethyl-1,4-butanediamine, 1-ethyl-1,4-butanediamine, 1,2-dimethyl-1,4-butanediamine, 1,3-dimethyl-1,4-butanediamine, 1,4-dimethyl-1,4-butanediamine and 2,3-dimethyl-1,4-butanediamine; an alicyclic diamine such as cyclohexanediamine, methylcyclohexanediamine, isophoronediamine, norbornanedimethylamine, tricyclodecanedimethylamine and menthenediamine; an aromatic diamine such as p-phenylenediamine, m-phenylenediamine, p-xylylenediamine, m-xylylenediamine and 4,4'-diaminodiphenylmethane; a triamine such as benzenetriamine, melamine and 2,4,6-triaminopyrimidine; and a tetraamine such as 2,4,5,6-tetraminopyrimidine.

Thermophysical properties and basicity of the resulting base vary depending on the substituent introduced to the position of $R^1$ and $R^2$.

A basic substance with larger basicity provides more effective catalytic action such as reducing the reaction initiation temperature at which the polymer precursor is reacted into a final product. It is thus possible, by the addition of a small amount of the basic substance, to cause the reaction into a final product at a lower temperature. In general, a secondary amine is larger in basicity than a primary amine and provides a large catalytic effect.

An aliphatic amine is more preferable than an aromatic amine since it has larger basicity.

It is preferable that the base generated in the present invention is a secondary amine and/or a heterocyclic compound because, in this case, the base generator becomes more highly sensitive. This is supposed to be because active hydrogen is lost at the amide bond site by using a secondary amine or heterocyclic compound; therefore, there is a change in electron density and thus an increase in isomerization sensitivity.

From the viewpoint of thermophysical properties and basicity of the base to be eliminated, the organic group of $R^1$ and $R^2$ are independently an organic group preferably having 1 to 20 carbon atoms, more preferably 1 to 12 carbon atoms, and particularly preferably 1 to 8 carbon atoms.

The base generated from the base generator represented by the chemical formula (1) is preferably a base which has one NH group that is able to form an amide bond. When the generated base has two or more NH groups that are able to form an amide bond, the base generator has two or more amide bonds that will be cut by exposure to electromagnetic radiation and heating, so that two or more light-absorbing groups such as a cinnamic acid derivative residue are present in a molecule. Normally in this case, there is a problem of deterioration in solvent solubility due to an increase in molecular weight. When there are two or more light-absorbing groups in a molecule, a base is generated by cutting one of the amide bonds each of which binds a base to light-absorbing groups; however, a base still having a light-absorbing group has a large molecular weight, resulting in poor diffusion properties and thus obtaining poor sensitivity when used as the base generator. In addition, when there is one light-absorbing group in a molecule, a relatively inexpensive base is added in an excessive amount to synthesize the base generator; however, when there are two or more light-absorbing groups, it is necessary to add an excessive amount of relatively expensive material for the light-absorbing groups. In the case of the base which has two or more NH groups that are able to form an amide bond, there is a problem of difficulty in purification after the synthesis. Especially when the base generator is combined with a polyimide precursor or polybenzoxazole precursor, the base which has one NH group that is able to form an amide bond is preferred.

When the base generator is combined with an epoxy compound or imidazole compound, as the base generated from the base generator represented by the chemical formula (1), one which has two or more NH groups that are able to form an amide bond can be suitably used because it can act as not only a curing accelerator but also a curing agent.

It is especially preferable that the structure of the thus-generated secondary amine and/or heterocyclic compound is represented by the following formula (2):

[Chemical formula 5]

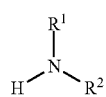

Formula (2)

wherein $R^1$ and $R^2$ are independently a monovalent organic group which is an alkyl group that has 1 to 10 carbon atoms and that may have a substituent, or a cycloalkyl group that has 4 to 12 carbon atoms and that may have a substituent; $R^1$ and $R^2$ may be the same or different; and $R^1$ and $R^2$ may be bound to form a cyclic structure which may contain a heteroatom.

In $R^1$ and $R^2$ of the formula (2), the alkyl group may be linear or branched. It is more preferable that the alkyl group is one having 1 to 8 carbon atoms and the cycloalkyl group is one having 4 to 10 carbon atoms. Also preferred is an alicyclic amine in which $R^1$ and $R^2$ are bound to form a cyclic structure that has 4 to 12 carbon atoms and that may have a substituent. Also, a heterocyclic compound in which $R^1$ and $R^2$ are bound to form a cyclic structure that has 2 to 12 carbon atoms and that may have a substituent, is preferred.

$R^3$, $R^4$, $R^5$ and $R^6$ are independently hydrogen, halogen, a hydroxyl group, a nitro group, a nitroso group, a mercapto group, a silyl group, a silanol group or a monovalent organic group and may be the same or different. Two or more of $R^3$, $R^4$, $R^5$ and $R^6$ may be bound to form a cyclic structure which may contain a heteroatom.

As halogen, there may be mentioned fluorine, chlorine and bromine.

The monovalent organic group is not particularly limited, and there may be mentioned a saturated or unsaturated alkyl group, a saturated or unsaturated cycloalkyl group, an aryl group, an aralkyl group, a saturated or unsaturated halogenated alkyl group and a cyano group, for example. These organic groups may contain a substituent or a bond other than a hydrocarbon group, such as a heteroatom, and they may be linear or branched.

The bond other than a hydrocarbon group in the organic group of $R^3$ to $R^6$ is not particularly limited, and there may be mentioned an ether bond, a thioether bond, a carbonyl bond, a thiocarbonyl bond, an ester bond, an amide bond, an urethane bond, a carbonate bond and a sulfonyl bond, for example.

The substituent other than a hydrocarbon group in the organic group of $R^3$ to $R^6$ is not particularly limited, and there may be mentioned a halogen atom, a hydroxyl group, a mercapto group, a cyano group, a silyl group, a silanol group, an alkoxy group, a nitro group, a carboxyl group, an acyl group, an acyloxy group, a sulfino group, a sulfo group, a saturated or unsaturated alkyl ether group, a saturated or unsaturated alkylthioether group, an arylether group, an arylthioether group and an amino group ($-NH_2$, $-NHR$ or $-NRR'$, and $R$ and $R'$ are independently a hydrocarbon group), for example. These groups may be linear, branched or cyclic.

In particular, preferred as the substituent other than a hydrocarbon group in the organic group of $R^3$ to $R^6$ are a halogen atom, a hydroxyl group, a mercapto group, a cyano group, a silyl group, a silanol group, an alkoxy group, an alkoxycarbonyl group, a nitro group, an acyl group, an acyloxy group, a saturated or unsaturated alkyl ether group, a saturated or unsaturated alkylthioether group, an arylether group and an arylthioether group.

Two or more of $R^3$ to $R^6$ may be bound to form a cyclic structure.

The cyclic structure may be a saturated or unsaturated alicyclic hydrocarbon, a heterocyclic ring, a condensed ring, or a structure comprising a combination of two or more selected from the group consisting of the alicyclic hydrocarbon, heterocyclic ring and condensed ring. For example, $R^3$ to $R^6$ may be such that two or more of them are bound to form a condensed ring such as naphthalene, anthracene, phenanthrene and indene, sharing an atom of a benzene ring to which $R^3$ to $R^6$ are bound.

In the present invention, it is preferable that at least one substituent is introduced to the substituents of the present invention, $R^3$ to $R^6$. That is, at least one of $R^3$, $R^4$, $R^5$ and $R^6$ is preferably halogen, a hydroxyl group, a nitro group, a nitroso group, a mercapto group, a silyl group, a silanol group or a monovalent organic group. By incorporating at least one substituent as described above to the substituents $R^3$ to $R^6$, it is possible to adjust the wavelength of a light that the base generator absorbs, and by incorporating a substituent, it is possible to make the base generator able to absorb a desired wavelength. By incorporating a substituent that can extend a conjugated chain of an aromatic ring, it is possible to shift the absorption wavelength of the base generator to a longer wavelength side. Furthermore, it is possible to increase the solubility of the base generator or the compatibility of the same with the polymer precursor to be combined therewith. Because of this, it is possible to increase the sensitivity of the photosensitive resin composition considering the absorption wavelength of the polymer precursor to be combined.

Interpretation of the Ultraviolet Spectra of Natural Products (A. I. Scott 1964) or tables in Spectrometric Identification of Organic Compounds, Fifth Edition (R. M. Silverstein 1993) can be referenced as a guideline for determining what substituent can be introduced to shift the absorption wavelength to a desired wavelength side.

Preferred as $R^3$ to $R^6$ are an alkyl group having 1 to 10 carbon atoms, a cycloalkyl group having 4 to 13 carbon atoms, a cycloalkenyl group having 4 to 13 carbon atoms, an aryloxyalkyl group having 7 to 16 carbon atoms ($-ROAr$ group), an aralkyl group having 7 to 20 carbon atoms, an alkyl group having 2 to 11 carbon atoms and a cyano group, an alkyl group having 1 to 10 carbon atoms and a hydroxyl group, an alkoxy group having 1 to 10 carbon atoms, an amide group having 2 to 11 carbon atoms, an alkylthio group having 1 to 10 carbon atoms ($-SR$ group), an acyl group having 1 to 10 carbon atoms, an ester group having 2 to 11 carbon atoms, an aryl group having 6 to 20 carbon atoms, an aryl group having 6 to 20 carbon atoms with substitution of an electron donating group and/or an electron attracting group, a benzyl group with substitution of an electron donating group and/or an electron attracting group, a cyano group, a methylthio group ($-SCH_3$), etc. These alkyl parts may be linear, branched or cyclic.

It is also preferable that two or more of $R^3$ to $R^6$ are bound to form a condensed ring such as naphthalene, anthracene, phenanthrene and indene, sharing the atom of the benzene ring to which $R^3$ to $R^6$ are bound, so that the absorption wavelength of the base generator is shifted to a longer wavelength side.

It is also preferable that at least one of $R^3$, $R^4$, $R^5$ and $R^6$ is a hydroxyl group in the base generator of the present invention, so that compared with a compound in which no hydroxyl group is contained in $R^3$, $R^4$, $R^5$ and $R^6$, solubility in basic aqueous solutions or the like can be increased and absorption wavelength can be shifted to a longer wavelength side. It is particularly preferable that $R^6$ is a phenolic hydroxyl group because there is an increase in the number of reaction sites which are reacted when cyclization of a compound isomerized into a cis isomer takes place, so that the cyclization becomes easy.

The structure represented by the chemical formula (1) is a trans isomer and/or a cis isomer, so that there may be used a trans isomer only or a mixture of a trans isomer and a cis isomer. However, because it is possible to increase the dissolution contrast, it is preferable that the percentage of a trans isomer is 90 to 100% and it is more preferable to use a trans isomer only.

When used in combination with a polyimide precursor or polybenzoxazole precursor, the base generator represented by the chemical formula (1) preferably has a 5% weight loss temperature of 100° C. or more, at which it causes a decrease in weight of 5% from its initial weight by heating. In the case of using a polyimide precursor or polybenzoxazole precursor, it is necessary to use a high-boiling-point solvent such as N-methyl-2-pyrrolidone to form a coating film. However, as just described, in the case where the base generator of the present invention has such a high 5% weight loss temperature, it is possible to form a coating film in a drying condition which can minimize an effect of a residual solvent. Because of this, it is possible to prevent a reduction in the dissolution contrast between the exposed and unexposed regions, which is due to the effect of the residual solvent.

It is also preferable that no impurities derived from the base generator of the present invention remain in a product that is produced by using the photosensitive resin composition of the present invention. Therefore, the base generator of the present invention is preferably decomposed or volatilized in a heating process conducted after development (or imidization process in the case where, for example, the polymer combined is a polyimide precursor). In particular, the temperature at which the base generator causes a decrease in weight of 50% from its initial weight (50% weight loss temperature) is preferably 400° C. or less, more preferably 350° C. or less. It is preferable that the base thus generated has a boiling point of 25° C. or more, so that handling is easy at room temperature. If the boiling point of the base thus generated is not 25° C. or more, in a coating film formed from the photosensitive resin composition of the present invention, an amine thus generated is likely to evaporate especially at the time of drying the film, which could make it difficult to process.

In the case of using the base generator represented by the formula (1), the heating temperature for generating a base is appropriately determined depending on the polymer precursor to be combined or on the intended purpose, and it is not particularly limited. The heating can be heating at a temperature of the environment where the base generator is placed (e.g., room temperature) and in this case, bases are gradually generated. Bases are generated even by heat that is produced as a by-product of exposure to electromagnetic radiation, so that heating can be performed substantially by the heat produced as the by-product during exposure to electromagnetic radiation. To increase the reaction rate and thus to efficiently generate a base, the heating temperature for generating a base is preferably 30° C. or more, more preferably 60° C. or more, still more preferably 100° C. or more, and particularly preferably 120° C. or more. However, the suitable heating temperature is not limited thereto because even the unexposed region can be cured by heating at 60° C. or more depending on the type of polymer precursor used in combination.

It is also preferable to heat at 300° C. or less to prevent decomposition of the base generator represented by the formula (1) other than base generation.

The base generator represented by the formula (1) can generate a base only by exposure to electromagnetic radiation; however, base generation is promoted by heating appropriately. Therefore, for efficient base generation, heating is performed after or during exposure to light when the base generator represented by the formula (1) is used. Heating and exposure to light may be performed alternately.

The most efficient method is to perform heating during exposure to light.

A method for synthesizing the base generator represented by the formula (1) of the present invention will be explained by taking 2-hydroxycinnamic acid amide as an example; however, the present invention is not limited thereto. The base generator of the present invention can be synthesized by conventionally known synthesis routes.

For example, 2-hydroxycinnamic acid amide can be synthesized by reacting 2-hydroxycinnamic acid with cyclohexylamine. It is possible to obtain a target by, in the presence of a condensing agent such as 1-ethyl-3-(3-dimethylaminopropyl) carbodiimide hydrochloride, dissolving 2-hydroxycinnamic acid and cyclohexylamine in tetrahydrofuran and stirring.

A cinnamic acid into which a substituent is introduced can be synthesized by performing a Wittig, Knoevenagel or Perkin reaction on hydroxybenzaldehyde having the corresponding substituent.

The base generator represented by the chemical formula (1) of the present invention has to have absorption at least part of exposure wavelengths so that the base generator can sufficiently fulfill its base generation function that is necessary to turn the polymer precursor into a final product. The wavelengths of a high pressure mercury lamp, which is a general exposing source, are 365 nm, 405 nm and 436 nm. It is thus preferable that the base generator represented by the chemical formula (1) of the present invention has absorption at least one of electromagnetic wavelengths of 365 nm, 405 nm and 436 nm. This is preferable because the types of applicable polymer precursors are increased further in this case.

It is preferable that the base generator represented by the chemical formula (1) has a molar absorbance coefficient of 100 or more at an electromagnetic wavelength of 365 nm or 1 or more at 405 nm, so that the types of applicable polymer precursors are increased further.

The fact that the base generator represented by the chemical formula (1) of the present invention has absorption at the above-mentioned wavelength range, can be proved by dissolving the base generator represented by the chemical formula (1) in a solvent having no absorption at the above wavelength range (e.g., acetonitrile) so as to reach a concentration of $1 \times 10^{-4}$ mol/L or less (it is normally about $1 \times 10^{-4}$ mol/L to $1 \times 10^{-5}$ mol/L and may be appropriately adjusted to obtain an appropriate intensity) and then measuring the absorbance with an ultraviolet-visible spectrophotometer (such as UV-2550 manufactured by Shimadzu Corporation).

Compared with conventionally used photobase generators, the base generator represented by the chemical formula (1) of the present invention has greater sensitivity and is thus available for various applications. Various photosensitive compositions can be produced by not only combining the base generator with a polymer precursor (described in detail below) which is reacted into a final product by a basic substance or by heating in the presence of a basic substance, but also by combining the same with a compound which has a structure or properties that can be changed by a base such as an acid-base indicator. Such photosensitive compositions can be used as a paint, a print ink, a sealing agent, an adhesive or a material for forming displays, semiconductor devices, electronic components, microelectromechanical systems (MEMS), optical elements or building materials.

For example, the base generator can be applied to a display such as an image forming media which comprises an image forming layer that contains at least a photobase generator and an acid-base indicator and that covers or penetrates a substrate, and which forms an image in such a manner that when the image forming layer is exposed to light, the photobase generator generates a base that is reactive with the acid-base indicator, thereby forming an image.

<Photosensitive Resin Composition>

The photosensitive resin composition of the present invention comprises a polymer precursor which is reacted into a final product by a basic substance or by heating in the presence of a basic substance, and the base generator of the present invention which is represented by the following chemical formula (1) and generates a base by exposure to electromagnetic radiation and heating:

[Chemical formula 6]

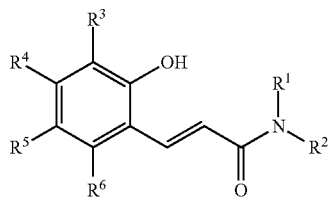

Formula (1)

wherein $R^1$ and $R^2$ are independently hydrogen or a monovalent organic group and may be the same or different; $R^1$ and $R^2$ may be bound to form a cyclic structure which may contain a heteroatom; at least one of $R^1$ and $R^2$ is a monovalent organic group; $R^3$, $R^4$, $R^5$ and $R^6$ are independently hydrogen, halogen, a hydroxyl group, a nitro group, a nitroso group, a mercapto group, a silyl group, a silanol group or a monovalent organic group and may be the same or different; two or more of $R^3$, $R^4$, $R^5$ and $R^6$ may be bound to form a cyclic structure which may contain a heteroatom.

As described above, the base generator represented by the formula (1) has the above-specified structure; therefore, when it is exposed to electromagnetic radiation, (—CH=CH—C(=O)—) is isomerized into a cis isomer and then generates a base ($NHR^1R^2$), by heating. In addition, when generating the base, the structure represented by the formula (1) is cyclized; therefore, it loses a phenolic hydroxyl group, resulting in a decrease in the solubility in a basic aqueous solution developer.

The polymer precursor is reacted into a final product by the action of the basic substance generated from the base generator.

In the photosensitive resin composition of the present invention, due to the base generator and change in solubility of the polymer precursor, a large difference in solubility occurs between the exposed and unexposed regions, that is, the dissolution contrast is increased, and thus it is possible to form a pattern.

As described above, the base generator represented by the formula (1) has higher sensitivity than conventional photobase generators, so that the photosensitive resin composition of the present invention becomes highly sensitive. Also, the photosensitive resin composition of the present invention can employ a wide range of polymer precursors, and it can be widely used in the field where the characteristics of the photosensitive resin composition can be utilized, such as the change in solubility of the polymer precursor and the base generator. For example, it can be suitably used in the field where the properties of a photosensitive polyimide precursor resin composition and an imidization product thereof can be utilized. According to the present invention, the dissolution contrast is increased due to the change in solubility of the base generator and that of the polymer precursor, so that even a polyimide precursor that is originally highly soluble in developers can be suitably used.

Hereinafter, components of the photosensitive resin composition of the present invention will be described. Herein, description of a base generator that can be used in the photosensitive resin composition of the present invention is omitted because one which is similar to the base generator of the present invention can be used. Accordingly, the polymer precursor and other components that can be contained in the photosensitive resin composition as needed, will be described in order.

As the base generator and polymer precursor, respectively, only one kind may be used, or a mixture of two or more kinds may be used.

<Polymer Precursor>

The polymer precursor used in the photosensitive resin composition of the present invention refers to a substance which is finally changed into a polymer with target properties by a reaction. The reaction includes an intermolecular reaction and an intramolecular reaction. The polymer precursor itself may be a relatively low molecular weight compound or a polymer compound.

Also, the polymer precursor of the present invention is a compound which is reacted into a final product by a basic substance or by heating in the presence of a basic substance. The embodiment in which the polymer precursor is reacted into a final product by a basic substance or by heating in the presence of a basic substance includes not only an embodiment in which the polymer precursor is changed into a final product only by the action of a basic substance but also an embodiment in which the reaction temperature at which the polymer precursor is changed into a final product by the action of a basic substance is lowered compared to the case without the action of a basic substance.

In the case where there is such a reaction temperature difference due to the absence or presence of a basic substance, only the polymer precursor coexisting with a basic substance is reacted into a final product to change the solubility in solvents such as a developer by utilizing the reaction temperature difference and heating at an appropriate temperature at which only the polymer precursor coexisting with the basic substance is reacted into a final product. Therefore, it is possible to change the solubility of the polymer precursor in the solvent by the absence or presence of a basic substance, and thus it is possible to form a pattern by development using the solvent as a developer.

As the polymer precursor of the present invention, any polymer precursor can be used without particular limitation as long as it can be reacted into a final product by a basic substance or by heating in the presence of a basic substance. The following are typical examples thereof; however, the polymer precursor of the present invention is not limited thereto.

[Polymer Precursor which can be Changed into a Polymer by an Intermolecular Reaction]

As the polymer precursor which can be changed into a target polymer by an intermolecular reaction, there may be mentioned a compound and polymer which have a reactive substituent and can cause a polymerization reaction, or a compound and polymer which can cause a reaction to form a bond between molecules (crosslinking reaction). As the reactive substituent, there may be mentioned an epoxy group, an oxetane group, a thiirane group, an isocyanate group, a hydroxyl group and a silanol group, for example. The polymer precursor includes a compound which can cause hydrolysis and polycondensation between molecules, and the reactive substituent includes —SiX (wherein X is a hydrolyzable group selected from the group consisting of an alkoxy group, an acetoxy group, an oxime group, an enoxy group, an amino group, an aminooxy group, an amide group and halogen) of a polysiloxane precursor.

As the compound which has a reactive substituent and can cause a polymerization reaction, there may be mentioned a compound having at least one epoxy group, a compound having at least one oxetane group, and a compound having at least one thiirane group, for example.

As the polymer which has a reactive substituent and can cause a polymerization reaction, there may be mentioned a polymer having two or more epoxy groups (epoxy resin), a polymer having two or more oxetane groups, and a polymer having two or more thiirane groups, for example. Especially, the compound and polymer having an epoxy group(s) will be described below in detail. The compound and polymer having an oxetane group(s) and those having a thiirane group(s) can be used similarly to those having an epoxy group(s).

(Compound and Polymer Having an Epoxy Group(s))

As the compound and polymer having at least one epoxy group, any conventionally known compounds and polymers can be used without particular limitation as long as they have at least one epoxy group in a molecule.

In general, the base generator also functions as a curing catalyst for a compound having at least one epoxy group in a molecule.

In the case of using the compound having at least one epoxy resin in a molecule or of using the polymer having two or more epoxy groups in a molecule (epoxy resin), a compound having in a molecule two or more functional groups that are reactive with an epoxy group, can be used in combination. As the functional groups that are reactive with an epoxy group, there may be mentioned carboxyl groups, phenolic hydroxyl groups, marcapto groups and primary or secondary aromatic amino groups, for example. Considering three-dimensionally curing properties, it is particularly preferable that one or more of the functional groups are contained in a molecule.

It is also preferable to use a polymer in which the above functional groups are introduced to a side chain of the polymer having a weight average molecular weight of 3,000 to 100,000. If the weight average molecular weight is less than 3,000, there is a decrease in film strength and the surface of a cured film becomes tacky, so that impurities could easily attach to the surface. It is not preferable that the weight average molecular weight is more than 100,000 because there is an increase in viscosity.

As the polymer having at least one epoxy group in a molecule, there may be mentioned epoxy resins for example, which include a bisphenol A type epoxy resin derived from a bisphenol A and an epichlorohydrin, a bisphenol F type epoxy resin derived from a bisphenol F and an epichlorohydrin, a bisphenol S type epoxy resin, a phenolic novolac type epoxy resin, a cresol novolac type epoxy resin, a bisphenol A novolac type epoxy resin, a bisphenol F novolac type epoxy resin, an alicyclic epoxy resin, a diphenyl ether type epoxy resin, a hydroquinone type epoxy resin, a naphthalene type epoxy resin, a biphenyl type epoxy resin, a fluorene type epoxy resin, multifunctional epoxy resins such as a trifunctional epoxy resin and tetrafunctional epoxy resin, a glycidyl ester type epoxy resin, a glycidyl amine type epoxy resin, a hydantoin type epoxy resin, an isocyanurate type epoxy resin, an aliphatic chain epoxy resin, etc. These epoxy resins may be halogenated or hydrogenated. Commercially available epoxy resin products include, but not limited to, JER COAT 828, 1001, 801N, 806, 807, 152, 604, 630, 871, YX8000, YX8034 and YX4000 manufactured by Japan Epoxy Resins Co., Ltd.; EPICLON 830, EXA835LV, HP4032D and HP820 manufactured by DIC Corporation; EP4100 series, EP4000 series and EPU series manufactured by ADEKA Corporation; CELLOXIDE series (2021, 2021P, 2083, 2085, 3000, etc.), EPOLEAD series and EHPE series manufactured by DAICEL Chemical Industries, Ltd.; YD series, YDF series, YDCN series and YDB series manufactured by Tohto Kasei Co., Ltd.; DENACOL series manufactured by Nagase ChemteX Corporation; and EPOLIGHT series manufactured by Kyoeisha Chemical Co., Ltd. These epoxy resins may be used in combination of two or more. Among them, preferred is a bisphenol type epoxy resin because, compared to other various epoxy compositions, bisphenol type epoxy resin products having different molecular weights are widely available and it is possible to optionally set adhesion, reactivity, etc.

On the other hand, as the compound which can cause a crosslinking reaction between molecules, there may be mentioned a combination of a compound having two or more isocyanate groups in a molecule with a compound having two or more hydroxyl groups in a molecule, for example. An urethane bond is formed between molecules by reaction of the isocyanate groups and hydroxyl groups, so that the combination can turn into a polymer.

As the polymer which can cause a crosslinking reaction between molecules, there may be mentioned a combination of a polymer having two or more isocyanate groups in a molecule (isocyanate resin) with a polymer having two or more hydroxyl groups in a molecule (polyol), for example.

Also, a combination of a compound and a polymer both of which can cause a crosslinking reaction between molecules, can be used. For example, there may be mentioned a combination of a polymer having two or more isocyanate groups in a molecule (isocyanate resin) with a compound having two or more hydroxyl groups in a molecule, a combination of a compound having two or more isocyanate groups in a molecule with a polymer having two or more hydroxyl groups in a molecule (polyol), etc.

(Compound and Polymer Having Isocyanate Groups)

As the compound and polymer having an isocyanate group(s), any conventionally known compounds and polymers may be used without particular limitation as long as they have two or more isocyanate groups in a molecule. As such a compound, there may be used an oligomer and a polymer which has a weight average molecular weight of 3,000 or more and in which isocyanate groups are present at a side chain or terminal, besides low-molecular-weight compounds as typified by a p-phenylene diisocyanate, 2,4-toluene diisocyanate, 2,6-toluene diisocyanate, 1,5-naphthalene diisocyanate, hexamethylene diisocyanate, etc.

(Compound and Polymer Having Hydroxyl Groups)

In general, the compound and polymer having an isocyanate group(s) is used in combination with a compound having a hydroxyl group in a molecule. As such a compound having a hydroxyl group, any conventionally known compounds may be used without particular limitation as long as they have two or more hydroxyl groups in a molecule. As such a compound, there may be used a polymer which has a weight average molecular weight of 3,000 or more and in which hydroxyl groups are present at a side chain or terminal, besides low molecular weight compounds such as ethylene glycol, propylene glycol, glycerin, diglycerin and pentaerythritol.

(Polysiloxane Precursor)

As the compound which can cause hydrolysis and polycondensation, there may be mentioned a polysiloxane precursor, for example.

As the polysiloxane precursor, there may be mentioned an organic silicon compound represented by $Y_nSiX_{(4-n)}$ (wherein Y is hydrogen or a phenyl group, vinyl group, fluoroalkyl group or alkyl group which may have a substituent; X is a hydrolyzable group selected from the group consisting of an alkoxy group, an acetoxy group, an oxime group, an enoxy group, an amino group, an aminooxy group, an amide group and halogen; and n is an integer of 0 to 3) and a hydrolyzed polycondensate of the organic silicon compound. Especially, preferred is one represented by the above formula wherein n is an integer of 0 to 2. As the hydrolyzable group, an alkoxy group is preferred in terms of the ease of preparing a silica-dispersed oligomer solution and availability.

The organic silicon compound is not particularly limited, and conventionally known organic silicon compounds may be used. For example, there may be used trimethoxysilane, triethoxysilane, methyltrichlorosilane, methyltrimethoxysilane, methyltriethoxysilane, methyltriisopropoxysilane, methyltri-t-butoxysilane, ethyltribromosilane, ethyltrimethoxysilane, ethyltriethoxysilane, n-propyltriethoxysilane, n-hexyltrimethoxysilane, phenyltrimethoxysilane, phenyltriethoxysilane, tetramethoxysilane, tetraethoxysilane, tetrabutoxysilane, dimethoxydiethoxysilane, dimethyldichlorosilane, dimethyldimethoxysilane, diphenyldimethoxysilane, vinyltrimethoxysilane, trifluoropropyltrimethoxysilane, γ-glycidoxypropylmethyldiethoxysilane, γ-glycidoxypropyltrimethoxysilane, γ-methacryloxypropylmethyldimethoxysilane, γ-aminopropylmethyldimethoxysilane, γ-mercaptopropylmethyldiethoxysilane, γ-mercaptopropyltrimethoxysilane, β-(3,4-epoxycyclohexyl) ethyltrimethoxysilane, fluoroalkylsilane which is known as a fluorine-containing silane coupling agent, and hydrolysis-condensation products or hydrolysis-cocondensation products thereof; and a mixture thereof.

[Polymer Precursor which is Changed into a Polymer by an Intramolecular Ring Closure Reaction]

As the polymer precursor which is finally changed into a polymer with target properties by an intramolecular ring closure reaction, there may be mentioned a polyimide precursor, a polybenzoxazole precursor, etc. Each of these precursors may be a mixture of two or more polymer precursors synthesized separately.

The polyimide precursor and polybenzoxazole precursor which are polymer precursors preferred in the present invention, will be described below. The present invention is not limited thereto, however.

(Polyimide Precursor)

As the polyimide precursor, a polyamic acid having a repeating unit represented by the following chemical formula (3) is suitably used:

[Chemical formula 7]

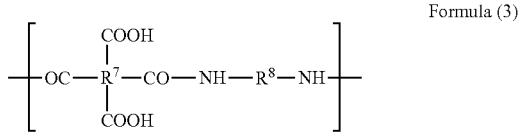

Formula (3)

wherein $R^7$ is a tetravalent organic group, and $R^8$ is a divalent organic group.

The tetravalence of $R^7$ refers only to a valence for bonding to acids; however, $R^7$ may have other substituent(s) further. Similarly, the divalence of $R^8$ refers only to a valence for bonding to amines; however, $R^8$ may have other substituent(s) further.

Polyamic acid is preferred because it can be obtained by only mixing an acid dianhydride with a diamine in a solution, so that it can be synthesized by an one-step reaction and obtained at low cost due to the ease of synthesis.

There is a secondary effect in which when the polymer precursor used is a polyamic acid, a low temperature is good enough for imidization due to the catalytic effect of the basic substance, so that it is possible to decrease final curing temperature to less than 300° C., more preferably to 250° C. or less. Conventional polyamic acid needs a final curing temperature of 300° C. or more for imidization and thus has limited applications; however, the present invention makes it possible to decrease the final curing temperature and thus to use polyamic acid in a wide range of applications.

Polyamic acid can be obtained by the reaction of an acid dianhydride with a diamine. To impart excellent heat resistance and dimensional stability to the finally-obtained polyimide, it is preferable in the chemical formula (3) that $R^7$ or $R^8$ is an aromatic compound, and it is more preferable that $R^7$ and $R^8$ are aromatic compounds. In this case, at $R^7$ of the chemical formula (3), four groups bound to $R^7$ ((—CO—)$_2$ (—COOH)$_2$) can be bound to the same aromatic ring or different aromatic rings. Similarly, at $R^8$ of the chemical formula (3), two groups bound to $R^8$ ((—NH—)$_2$) can be bound to the same aromatic ring or different aromatic rings.

The polyamic acid represented by the chemical formula (3) can be one comprising a single repeating unit or one comprising two or more kinds of repeating units.

Conventionally known methods can be used as the method for producing the polyimide precursor of the present invention. For example, there may be mentioned, but not limited to, (1) a method for synthesizing a polyamic acid (precursor) from an acid dianhydride and a diamine and (2) a method for synthesizing a polyimide precursor by reacting a carboxylic acid of an ester acid or amide acid monomer with a diamino compound or derivative thereof, the ester acid or amide acid monomer being synthesized by reacting an acid dianhydride with a monovalent alcohol, amino compound, epoxy compound or the like.

As the acid dianhydride which can be applied to the reaction for obtaining the polyimide precursor of the present invention, for example, there may be mentioned aliphatic tetracarboxylic dianhydrides such as ethylenetetracarboxylic dianhydride, butanetetracarboxylic dianhydride, cyclobutanetetracarboxylic dianhydride, methylcyclobutanetetracarboxylic dianhydride and cyclopentanetetracarboxylic dianhydride; and aromatic tetracarboxylic dianhydrides such as pyromellitic dianhydride, 3,3',4,4'-benzophenonetetracarboxylic dianhydride, 2,2',3,3'-benzophenonetetracarboxylic dianhydride, 2,3',3,4'-benzophenonetetracarboxylic dianhydride, 3,3',4,4'-biphenyltetracarboxylic dianhydride, 2,2',3,3'-biphenyltetracarboxylic dianhydride, 2,3',3,4'-biphenyltetracarboxylic dianhydride, 2,2',6,6'-biphenyltetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride,
2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{-4-[3-(1,2-dicarboxy)phenoxy]phenyl}sulfide dianhydride, 2,2-bis{4-[4-(1,2-dicarboxy)phenoxy]phenyl}-1,1,1,3,3,3-hexafluoropropane dianhydride, 2,2-bis{4-[3-(1,2-dicarboxy)phenoxy]phenyl}-1,1,1,3,3,3-hexafluoropropane dianhydride, 2,3,6,7-naphthalenetetracarboxylic dianhydride, 1,1,1,3,3,3-hexafluoro-2,2-bis(2,3- or 3,4-dicarboxyphenyl)propane dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, pyridinetetracarboxylic dianhydride, sulfonyldiphthalic anhydride, m-terphenyl-3,3',4,4'-tetracarboxylic dianhydride and p-terphenyl-3,3',4,4'-tetracarboxylic dianhydride. They may be used solely or in combination of two or more. Particularly preferably used tetracarboxylic dianhydrides include pyromellitic dianhydride, 3,3',4,4'-benzophenonetetracarboxylic dianhydride, 3,3',4,4'-biphenyltetracarboxylic dianhydride, 2,2',6,6'-biphenyltetracarboxylic dianhydride, bis(3,4-dicarboxyphenyl)ether dianhydride, and 2,2-bis(3,4-dicarboxyphenyl)-1,1,1,3,3,3-hexafluoropropane dianhydride.

It is possible to control physical properties (e.g., solubility and thermal expansion coefficient) without a large deterioration in transparency by using an acid dianhydride introducing fluorine or an acid dianhydride having an alicyclic skeleton structure as a combined acid dianhydride. The finally-obtained polyimide is provided with a small linear thermal expansion coefficient by using a rigid acid dianhydride such as pyromellitic dianhydride, 3,3',4,4'-biphenyltetracarboxylic dianhydride and 1,4,5,8-naphthalenetetracarboxylic dianhydride; however, there is a tendency that the use inhibits transparency improvement, so that the acid dianhydride can be used concurrently, paying attention to copolymerization ratio.

On the other hand, as the amine component, one diamine may be used solely or two or more kinds of diamines may be used in combination. No limitation is imposed on the diamine component(s) and there may be mentioned aromatic amines such as p-phenylenediamine, m-phenylenediamine, o-phenylenediamine, 3,3'-diaminodiphenylether, 3,4'-diaminodiphenylether, 4,4'-diaminodiphenylether, 3,3'-diaminodiphenylsulfide, 3,4'-diaminodiphenylsulfide, 4,4'-diaminodiphenylsulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, 4,4'-bis[4-(4-aminophenoxy)phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindan, and 6,6'-bis(4-aminophenoxy)-3,3,3',3'-tetramethyl-1,1'-spirobiindan;

aliphatic amines such as 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis[2-aminomethoxy)ethyl]ether, bis[2-(2-aminoethoxyl)ethyl]ether, bis[2-(3-aminoprotoxy)ethyl]ether, 1,2-bis(aminomethoxy)ethane, 1,2-bis(2-aminoethoxyl)ethane, 1,2-bis[2-(aminomethoxy)ethoxy]ethane, 1,2-bis[2-(2-aminoethoxyl)ethoxy]ethane, ethylene glycol bis(3-aminopropyl)ether, diethylene glycol bis(3-aminopropyl)ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane; and alicyclic diamines such as 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, and 2,5-bis(aminomethyl)bicyclo[2.2.1]heptane. As guanamines, there may be mentioned acetoguanamine, benzoguanamine, etc. Also, it is possible to use a diamine that is obtained by replacing part or all of hydrogen atoms on the aromatic ring of any of the above-mentioned diamines with a substituent, which is selected from a fluoro group, a methyl group, a methoxy group, a trifluoromethyl group or a trifluoromethoxy group.

Furthermore, depending on the intended purpose, any one or two or more of an ethynyl group, a benzocyclobutene-4'-yl group, a vinyl group, an allyl group, a cyano group, an isocyanate group and an isopropenyl group can be incorporated into part or all of hydrogen atoms on the aromatic ring of any of the above-mentioned diamines as a substituent, the groups serving as a crosslinking point.

The diamine can be selected depending on target properties and the finally-obtained polyimide is provided with a low thermal expansion coefficient by using a rigid diamine such as p-phenylenediamine. As the rigid diamine, there may be mentioned a diamine in which two amino groups are bound to one aromatic ring, such as p-phenylenediamine, m-phenylenediamine, 1,4-diaminonaphthalene, 1,5-diaminonaphthalene, 2,6-diaminonaphthalene, 2,7-diaminonaphthalene and 1,4-diaminoanthracene.

Moreover, there may be mentioned a diamine in which two or more aromatic rings are connected via a single bond and two or more amino groups are each bound to the different aromatic rings directly or as a part of a substituent, such as one represented by the following formula (4). In particular, there may be mentioned a benzidine, for example.

[Chemical formula 8]

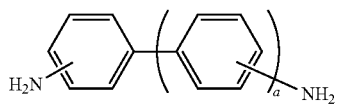

Formula (4)

In the chemical formula (4), a is a natural number of 1 or more, and each of the amino groups is bound to the meta- or para-position of the bond between the benzene rings.

Also, there may be used a diamine that is represented by the formula (4) in which a substituent is present in a position of each benzene ring, the position being not involved in bonding to the other benzene ring and not replaced with an amino group. The substituents are monovalent organic groups; however, they may be bound to each other.

Specific examples thereof include a 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl and 3,3'-dimethyl-4,4'-diaminobiphenyl.

When using the finally-obtained polyimide as an optical waveguide or optical circuit component, it is possible to increase the transmittance of the polyimide at an electromagnetic wave having a wavelength of 1 μm or less by introducing a fluorine as a substituent of each aromatic ring.

On the other hand, when a diamine having a siloxane skeleton is used as the diamine, such as 1,3-bis(3-aminopropyl)tetramethyldisiloxane, the elastic modulus of the finally-obtained polyimide is decreased, thereby decreasing the glass transition temperature of the same.

From the viewpoint of heat resistance, the diamine selected herein is preferably an aromatic diamine; however, depending on target properties, a diamine other than aromatic diamine (e.g., aliphatic diamine and siloxane-based diamine) may be used in an amount that does not exceed 60% by mole, preferably 40% by mole of the whole diamine.

To synthesize the polyimide precursor, a solution prepared by dissolving for example 4,4'-diaminodiphenylether as the amine component in an organic polar solvent such as N-methylpyrrolidone, is cooled and while the cooling of the solution, an equimolar 3,3',4,4'-biphenyltetracarboxylic dianhydride is gradually added thereto and stirred, thereby obtaining a polyimide precursor solution.

To impart heat resistance and dimensional stability to the finally-obtained polyimide, the polyimide precursor synthesized in this way is preferably such that copolymerization ratio of the aromatic acid component and/or aromatic amine component is as large as possible. In particular, the ratio of the aromatic acid component in the acid component constituting the repeating unit of imide structure is preferably 50% by mole or more, particularly preferably 70% by mole or more. The ratio of the aromatic amine component in the amine component constituting the repeating unit of imide structure is preferably 40% by mole or more, particularly preferably 60% by mole or more, and a wholly aromatic polyimide is particularly preferable.

<Polybenzoxazole Precursor>

As the polybenzoxazole precursor used in the present invention, a polyamide alcohol having a repeating unit represented by the following chemical formula (5) is suitably used.

The polyamide alcohol can be synthesized by conventionally known methods. For example, it can be obtained by addition reaction of a dicarboxylic acid derivative (e.g., dicarboxylic acid halide) with dihydroxydiamine in an organic solvent.

[Chemical formula 9]

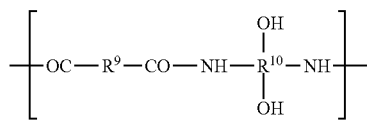

Formula (5)

In the chemical formula (5), $R^9$ is a divalent organic group and $R^{10}$ is a tetravalent organic group.

The divalence of $R^9$ refers only to a valence for bonding to acids; however, $R^9$ may have other substituent(s) further. Similarly, the tetravalence of $R^{10}$ refers only to a valence for bonding to amines and hydroxyl groups; however, $R^{10}$ may have other substituent(s) further.

To impart excellent heat resistance and dimensional stability to the finally-obtained polybenzoxazole, the polyamide alcohol having a repeating unit represented by the chemical formula (5) is preferably such that $R^9$ or $R^{40}$ of the chemical formula (5) is an aromatic compound, and it is more preferable that $R^9$ and $R^{10}$ are aromatic compounds. In this case, at $R^9$ of the chemical formula (5), two groups bound to $R^9$ ((—CO—)$_2$) can be bound to the same aromatic ring or different aromatic rings. Similarly, at $R^{10}$ of the $R^{10}$ chemical formula (5), four groups bound to ((—NH—)$_2$(—OH)$_2$) can be bound to the same aromatic ring or different aromatic rings.

The polyamide alcohol represented by the chemical formula (5) can be one comprising a single repeating unit or one comprising two or more kinds of repeating units.

As the dicarboxylic acid or derivative thereof which can be applied to the reaction for obtaining the polybenzoxazole precursor, there may be mentioned, but not limited to, a phthalic acid, isophthalic acid, terephthalic acid, 4,4'-benzophenone dicarboxylic acid, 3,4'-benzophenone dicarboxylic acid, 3,3'-benzophenone dicarboxylic acid, 4,4'-biphenyldicarboxylic acid, 3,4'-biphenyldicarboxylic acid, 3,3'-biphenyldicarboxylic acid, 4,4'-diphenyl ether dicarboxylic acid, 3,4'-diphenyl ether dicarboxylic acid, 3,3'-diphenyl ether dicarboxylic acid, 4,4'-diphenylsulfone dicarboxylic acid, 3,4'-diphenylsulfone dicarboxylic acid, 3,3'-diphenylsulfone dicarboxylic acid, 4,4'-hexafluoroisopropylidene dibenzoic acid, 4,4'-dicarboxydiphenylamide, 1,4-phenylenediethanoic acid, 1,1-bis(4-carboxyphenyl)-1-phenyl-2,2,2-trifluoroethane, bis(4-carboxyphenyl)tetraphenyldisiloxane, bis(4-carboxyphenyl)tetramethyldisiloxane, bis(4-carboxyphenyl)sulfone, bis(4-carboxyphenyl)methane, 5-t- butylisophthalic acid, 5-bromoisophthalic acid, 5-fluoroisophthalic acid, 5-chloroisophthalic acid, 2,2-bis-(p-carboxyphenyl)propane, 4,4'-(p-phenylenedioxy)dibenzoic acid, 2,6-naphthalenedicarboxylic acid, acid halides thereof, and active esters produced by combining the above components with a hydroxybenzotriazole or the like, etc. They are used solely or in combination of two or more.

Specific examples of the dihydroxydiamine include, but not limited to, a 3,3'-dihydroxybenzidine, 3,3'-diamino-4,4'-dihydroxybiphenyl, 4,4'-diamino-3,3'-dihydroxybiphenyl, 3,3'-diamino-4,4'-dihydroxydiphenyl sulfone, 4,4'-diamino-3,3'-dihydroxydiphenyl sulfone, bis-(3-amino-4-hydroxyphenyl)methane, 2,2-bis-(3-amino-4-hydroxyphenyl)propane, 2,2-bis-(3-amino-4-hydroxyphenyl) hexafluoropropane, 2,2-bis-(4-amino-3-hydroxyphenyl) hexafluoropropane, bis-(4-amino-3-hydroxyphenyl)methane, 2,2-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, 3-diamino-4,6-dihydroxybenzene. They are used solely or in combination of two or more.

The polymer precursor such as polyimide precursor and polybenzoxazole precursor preferably shows a transmittance of at least 5% or more, more preferably 15% or more at an exposure wavelength when it is formed into a film having a thickness of 1 μm, so that when it is made into a photosensitive resin composition, the composition is provided with high sensitivity and thus a pattern shape that can accurately replicate a mask pattern is obtained.

The higher the transmittance of the polymer precursor (such as polyimide precursor and polybenzoxazole precursor) at an exposure wavelength, the smaller the loss of electromagnetic radiation, thereby obtaining a highly sensitive photosensitive resin composition.

In the case of using a high pressure mercury lamp, which is a general exposure source, to expose the polymer precursor, the polymer precursor preferably has a transmittance of 5% or more, more preferably 15%, particularly preferably 50% or more at one of electromagnetic radiation wavelengths of at least 436 nm, 405 nm and 365 nm, when it is formed into a film having a thickness of 1 μm.

The weight average molecular weight of the polymer precursor such as the polyimide precursor and polybenzoxazole precursor is, although it depends on the intended use, preferably in the range of 3,000 to 1,000,000, more preferably in the range of 5,000 to 500,000, and still more preferably in the range of 10,000 to 500,000. When the weight average molecular weight is less than 3,000, it is difficult to impart sufficient strength to a coating or film that is made of the polymer precursor. Also, low strength is imparted to a film which is made of a polymer (e.g., polyimide) that is obtained by performing a heating treatment or the like on the polymer precursor. On the other hand, when the weight average molecular weight exceeds 1,000,000, the viscosity of the polymer precursor is increased and the solubility of the same is likely to decrease, so that it is difficult to obtain a coating or film that has a smooth surface and uniform thickness.

The molecular weight used herein refers to a polystyrene-equivalent value obtained by gel permeation chromatography (GPC). It may be the molecular weight of the polymer precursor itself, such as the polyimide precursor, or may be the molecular weight after a chemical imidization treatment is performed thereon with an acetic anhydride.

The solvent used for the synthesis of the polyimide precursor or polybenzoxazole precursor is preferably a polar solvent. Typical examples thereof include N-methyl-2-pyrrolidone, N-acetyl-2-pyrrolidone, N,N-dimethylformamide, N,N-dimethylacetamide, N,N-diethylformamide, N,N-diethylacetamide, N,N-dimethylmethoxyacetamide, dimethylsulfoxide, hexamethylphosphoramide, pyridine, dimethyl sulfone, tetramethylene sulfone, dimethyltetramethylene sulfone, diethylene glycol dimethyl ether, cyclopentanone, γ-butyrolactone and α-acetyl-γ-butyrolactone, for example. These solvents are used solely or in combination of two or more. Other solvents which can be used in combination include nonpolar solvents such as benzene, benzonitrile, 1,4-dioxane, tetrahydrofuran, butyrolactone, xylene, toluene and cyclohexanone. These solvents are used as a dispersion medium for raw materials, a reaction control agent, an agent for controlling solvent volatilization from a product, a coating film smoothing agent, etc.

The solubility of the polyamic acid or polybenzoxazole precursor is decreased as the reaction of the same into a final product is promoted by the action of a basic substance. Therefore, when combined with a decrease in solubility that is due to the base generated from the base generator represented by the chemical formula (1), there is an advantage that the dissolution contrast between the exposed and unexposed regions of the photosensitive resin composition of the present invention is increased further.

<Other Components>

The photosensitive resin composition of the present invention can be a simple mixture of the base generator represented by the chemical formula (1), one or more polymer precursors and a solvent. Also, it can be prepared by adding a photo- or heat-curable component, a non-polymerizable binder resin other than the polymer precursor and other component to the mixture.

Various kinds of general-purpose solvents can be used as the solvent for dissolving, dispersing or diluting the photosensitive resin composition. When a polyamic acid is used as the precursor, a solution obtained by the synthesis reaction of the polyamic acid can be used as it is, and the solution can be mixed with other component as needed.

Usable general-purpose solvents include, for example, ethers such as diethyl ether, tetrahydrofuran, dioxane, ethylene glycol dimethyl ether, ethylene glycol diethyl ether, propylene glycol dimethyl ether and propylene glycol diethyl ether; glycol monoethers (so-called cellosolves) such as ethylene glycol monomethyl ether, ethylene glycol monoethyl ether, propylene glycol monomethyl ether, propylene glycol monoethyl ether, diethylene glycol monomethyl ether and diethylene glycol monoethyl ether; ketones such as methyl ethyl ketone, acetone, methyl isobutyl ketone, cyclopentanone and cyclohexanone; esters such as ethyl acetate, butyl acetate, n-propyl acetate, i-propyl acetate, n-butyl acetate, i-butyl acetate, acetic esters of the above-mentioned glycol monoethers (e.g., methyl cellosolve acetate and ethyl cellosolve acetate), methoxypropyl acetate, ethoxypropyl acetate, dimethyl oxalate, methyl lactate and ethyl lactate; alcohols such as ethanol, propanol, butanol, hexanol, cyclohexanol, ethylene glycol, diethylene glycol and glycerin; halogenated hydrocarbons such as methylene chloride, 1,1-dichloroethane, 1,2-dichloroethylene, 1-chloropropane, 1-chlorobutane, 1-chloropentane, chlorobenzene, bromobenzene, o-dichlorobenzene and m-dichlorobenzene; amides such as N,N-dimethylformamide, N,N-diethylformamide, N,N-dimethylacetamide and N,N-diethylacetamide; pyrrolidones such as N-methylpyrrolidone; lactones such as γ-butyrolactone; sulfoxides such as dimethylsulfoxide; and other organic polar solvents. In addition, there may be mentioned aromatic hydrocarbons such as benzene, toluene and xylene, and other organic nonpolar solvents. These solvents are used solely or in combination.

Among them, preferred are polar solvents such as N-dimethylacetamide, N,N-diethylformamide, N,N-diethylacetamide, N,N-dimethylmethoxyacetamide, dimethylsulfoxide, hexamethylphosphoamide, N-acetyl-2-pyrrolidone, pyridine, dimethyl sulfone, tetramethylene sulfone dimethyltetramethylene sulfone, diethylene glycol dimethyl ether, cyclopentanone, γ-butyrolactone and α-acetyl-γ-butyrolactone.

As the photocurable component, a compound having one or two or more ethylenically unsaturated bonds can be used.

For example, there may be mentioned an amide monomer, a (meth)acrylate monomer, an urethane (meth)acrylate oligomer, a polyester (meth)acrylate oligomer, an epoxy (meth) acrylate, a hydroxyl group-containing (meth)acrylate and an aromatic vinyl compound such as styrene. In the case where the polyimide precursor contains a carboxylic acid component such as polyamic acid in its structure, the use of an ethylenically unsaturated bond-containing compound having a tertiary amino group allows formation of an ion bond between the tertiary amino group and the carboxylic acid of the polyimide precursor. Therefore, when the polyimide precursor is made into the photosensitive resin composition, the dissolution rate contrast between the exposed and unexposed regions is increased.

In the case of using such a photocurable composition having an ethylenically unsaturated bond, a photoradical generator may be added further. As the photoradical generator, for example, there may be mentioned benzoins such as benzoin, benzoin methyl ether, benzoin ethyl ether and benzoin isopropyl ether, and alkyl ethers thereof; acetophenones such as acetophenone, 2,2-dimethoxy-2-phenylacetophenone, 2,2-diethoxy-2-phenylacetophenone, 1,1-dichloroacetophenone, 1-hydroxyacetophenone, 1-hydroxycyclohexyl phenyl ketone and 2-methyl-1-[4-(methylthio)phenyl]-2-morpholino-propane-1-on; anthraquinones such as 2-methylanthraquinone, 2-ethylanthraquinone, 2-tert-butylanthraquinone, 1-chloroanthraquinone and 2-amylanthraquinone; thioxanthones such as 2,4-dimethylthioxanthone, 2,4-diethylthioxanthone, 2-chlorothioxanthone and 2,4-diisopylthioxanthone; ketals such as acetophenone dimethyl ketal and benzil dimethyl ketal; monoacyl phosphine oxides or bisacyl phosphine oxides such as 2,4,6-trimethylbenzoyl diphenylphosphine oxide; benzophenones such as benzophenone; and xanthones.

To the extent that does not inhibit the advantageous effects of the present invention, other photosensitive component can be added to the photosensitive resin composition of the present invention, the component playing a supporting role to the base generator of the present invention and generating an acid or base by light. Also, a base amplifier or sensitizer can be added.

As the compound which generates an acid by light, there may be mentioned a photosensitive diazoquinone compound having a 1,2-benzoquinonediazide or 1,2-naphthoquinonediazide structure, which is described in the specifications of U.S. Pat. Nos. 2,772,972, 2,797,213 and 3,669,658. Also, there may be used a conventionally known photoacid generator such as triazine or a derivative thereof, an oxime sulfonate compound, an iodonium sulfonate and a sulfonium sulfonate. As the compound which generates a base by light, there may be mentioned a 2,6-dimethyl-3,5-dicyano-4-(2'-nitrophenyl)-1,4-dihydropyridine, 2,6-dimethyl-3,5-diacetyl-4-(2'-nitrophenyl)-1,4-dihydropyridine and 2,6-dimethyl-3,5-diacetyl-4-(2',4'-dinitrophenyl)-1,4-dihydropyridine, for example.

A base amplifier can be used in combination, which is decomposed or cause a rearrangement reaction by the action of a small amount of base generated from the base generator, thereby generating a base. As the base amplifier, for example, there may be mentioned a compound having a 9-fluorenylmethyl carbamate bond, a compound having 1,1-dimethyl-2-cyanomethyl carbamate bond $((CN)CH_2C(CH_3)_2OC(O)NR_2)$ a compound having p-nitrobenzyl carbamate bond, a compound having 2,4-dichlorobenzyl carbamate bond, urethane-based compounds described in paragraphs [0010] to [0032] of JP-A No. 2000-330270 and urethane-based compounds described in paragraphs [0033] to [0060] of JP-A 2008-250111, for example.

Adding a sensitizer can be effective when it is required to increase the sensitivity of the resin composition by allowing the base generator to sufficiently utilize the energy of an electromagnetic wave having a wavelength that passes through a polymer.

Especially in the case where the polyimide precursor also absorbs light at a wavelength of 360 nm or more, addition of a sensitizer is particularly effective. Specific examples of compounds called sensitizers include derivatives of thioxanthone, diethylthioxanthone and derivatives thereof; coumarins and derivatives thereof; ketocoumarin and a derivative thereof; ketobiscoumarin and a derivative thereof; cyclopentanone and a derivative thereof; cyclohexanone and a derivative thereof; a thiopyrylium salt and derivative thereof; thioxanthenes, xanthenes and derivatives thereof.

Specific examples of coumarins, ketocoumarin and derivatives thereof include 3,3'-carbonylbiscoumarin, 3,3'-carbonylbis(5,7-dimethoxycoumarin) and 3,3'-carbonylbis(7-acetoxycoumarin). Specific examples of thioxanthone and a derivative thereof include diethylthioxanthone and isopropylthioxanthone. In addition, there may be mentioned benzophenone, acetophenone, phenanthrene, 2-nitrofluorene, 5-nitroacenaphthene, benzoquinone, 2-ethylanthraquinone, 2-tert-butylanthraquinone, 1,2-benzanthraquinone and 1,2-naphthoquinone.

They exert a particularly excellent effect when combined with a base generator, so that a sensitizer that shows an optimal sensitizing effect is appropriately selected depending on the structure of the used base generator.

Other various organic or inorganic small- or high-molecular weight compounds can be added to impart processability and various kinds of functionality to the resin composition of the present invention. For example, there may be used a dye, a surfactant, a leveling agent, a plasticizer, a fine particles, etc. The fine particles include, for example, organic fine particles such as polystyrene and polytetrafluoroethylene, and inorganic fine particles such as colloidal silica, carbon and layered silicate. They may be porous or hollow. Functions or forms thereof include a pigment, filler, fiber, etc.

From the viewpoint of physical properties of the resulting pattern, especially layer strength and heat resistance, the polymer precursor (solid content) contained in the photosensitive resin composition of the present invention is preferably 30% by weight or more, more preferably 50% by weight or more of the total solid content of the photosensitive resin composition.

The base generator represented by the chemical formula (1) is normally contained in the range of 0.1 to 95% by weight, preferably in the range of 0.5 to 60% by weight of the solid content of the polymer precursor contained in the photosensitive resin composition. When less than 0.1% by weight, the dissolution contrast between the exposed and unexposed region could not be sufficiently increased. When more than 95% by weight, properties of the finally-obtained cured resin are poorly reflected in the final product.

In the case where the base generator is used as a curing agent, such as when mixed with an epoxy compound, it is normally contained in the range of 0.1 to 95% by weight, preferably in the range of 0.5 to 60% by weight, depending on the degree of cure.

In the case where the base generator is used as a curing accelerator, the photosensitive resin composition can be cured by adding a small amount of the base generator. The base generator represented by the chemical formula (1) is generally contained in the range of 0.1 to 30% by weight, preferably in the range of 0.5 to 20% by weight of the solid content of the polymer precursor contained in the photosensitive resin composition.

The solid content of the photosensitive resin composition refers to all components other than a solvent and includes a liquid monomer component.

The mixing ratio of an optional component(s) other than a solvent is preferably in the range of 0.1% by weight to 95% by weight of the total solid content of the photosensitive resin composition. When less than 0.1% by weight, the addition of the additive(s) is not very effective. When more than 95% by weight, properties of the finally-obtained cured resin are poorly reflected in the final product.

The photosensitive resin composition of the present invention can be used in various kinds of coating and molding processes to give a film or three-dimensional molded product.

As an embodiment of the photosensitive resin composition of the present invention, in the case where the polyimide precursor or polybenzoxazole precursor is used as the polymer precursor, the polyimide and polybenzoxazole thus obtained has a 5% weight loss temperature measured in a nitrogen atmosphere of preferably 250° C. or more, more preferably 300° C. or more from the viewpoint of obtaining properties such as heat resistance, dimensional stability and insulation property. Especially in the case where the photosensitive resin composition of the present invention is used in an application such as an electronic component that undergoes a solder reflow process, if the photosensitive resin composition has a 5% weight loss temperature of 300° C. or less, a failure such as air bubbles could be caused by cracked gas that is produced in the solder reflow process.

Herein, "5% weight loss temperature" refers to a temperature at which the weight of a sample causes a decrease in weight of 5% from its initial weight (that is, at which the weight of the sample is 95% of the initial weight) when measuring the weight loss with a thermogravimetric analyzer. Similarly, "10% weight loss temperature" refers to a temperature at which the weight of a sample causes a decrease in weight of 10% from the initial weight.

Glass transition temperature of the polyimide and polybenzoxazole obtained from the photosensitive resin composition of the present invention is preferred to be as high as possible from the viewpoint of heat resistance. In an application in which a thermoforming process is expected, such as an optical waveguide, the photosensitive resin composition of the present invention preferably shows a glass transition temperature of about 120° C. to 450° C., more preferably a glass transition temperature of about 200° C. to 380° C.

When the polyimide and polybenzoxazole obtained from the photosensitive resin composition can be formed into a film, the glass transition temperature of the present invention can be obtained from the peak temperature of tan θ (tan δ=loss elastic modulus (E")/storage elastic modulus (E')) by dynamic viscoelasticity measurement. The dynamic viscoelasticity measurement can be carried out with a dynamic viscoelasticity measuring apparatus such as Solid Analyzer RSA II (manufactured by Rheometric Scientific Inc.) at a frequency of 3 Hz and a heating rate of 5° C./min. When the polyimide and polybenzoxazole obtained from the photosensitive resin composition cannot be formed into a film, the glass transition temperature is determined from the temperature of an inflection point of a baseline obtained by differential thermal analysis (DTA).

From the viewpoint of dimensional stability of the polyimide and polybenzoxazole that is obtained from the photosensitive resin composition of the present invention, the photosensitive resin composition preferably has a linear thermal expansion coefficient of 60 ppm or less, more preferably 40 ppm or less. To form a film on a silicon wafer in the process of producing a semiconductor device, etc., from the viewpoint of adhesion and warpage of a substrate, the linear thermal expansion coefficient is preferably 20 ppm or less.

In the present invention, the linear thermal expansion coefficient can be obtained by measuring a film of the polyimide and polybenzoxazole obtained from the photosensitive resin composition of the present invention with a thermal mechanical analyzer (TMA). It can be obtained by using a thermal mechanical analyzer (such as Thermo Plus TMA8310 manufactured by Rigaku Corporation) at a heating rate of 10° C./min and a tensile load of 1 g/25,000 µm² so that a uniform load is applied per cross-sectional area of an evaluation sample.

As described above, according to the present invention, because the photosensitive resin composition can be obtained by a simple method of mixing the polymer precursor with the base generator represented by the chemical formula (1), the present invention provides excellent cost performance.

An aromatic component-containing carboxylic acid and basic substance that constitute the base generator represented by the chemical formula (1) are available at low costs, so that the price of the photosensitive resin composition can be low.

Due to the base generator represented by the chemical formula (1), the photosensitive resin composition of the present invention can be used to promote the reaction of various kinds of polymer precursors into a final product, and the structure of the finally-obtained polymer can be selected from a wide range of structures.

In addition, when a base is generated, the base generator represented by the chemical formula (1) is cyclized and thus loses a phenolic hydroxyl group, so that it changes its solubility in developers such as a basic solution and assists in lowering the solubility of the photosensitive resin composition when the polymer precursor is the polyimide precursor, polybenzoxazole precursor or the like, thereby contributing to increasing the dissolution contrast between the exposed and unexposed regions.

Also, due to the catalytic effect of a basic substance (e.g., amine) generated by exposure to electromagnetic radiation, it is possible to decrease a process temperature that is required for a reaction such as cyclization (e.g., imidization of the polyimide precursor or polybenzoxazole precursor into a final product). Therefore, it is possible to reduce the load on the process and heat damage to a final product.

Furthermore, when a heating step is included in the process of obtaining a final product from the polymer precursor, the heating step can be utilized by the base generator of the present invention which generates a base by exposure to electromagnetic radiation and heating; therefore, it is possible to reduce the dose of electromagnetic radiation and also to use the step efficiently.

The photosensitive resin composition of the present invention can be used in all conventionally-known fields and products which use a resin material, such as a print ink, a paint, a sealing agent, an adhesive, an electronic material, an optical circuit component, a molding material, a resist material, a building material, a stereolithography product and an optical element. It can be suitably used in any of applications such as an application in which the photosensitive resin composition is subjected to whole surface exposure to use, such as a paint, a sealing agent and an adhesive, and an application in which the photosensitive resin composition is used to form a pattern, such as a permanent film and a stripping film.

The photosensitive resin composition of the present invention is suitably used in a wide range of fields and products for which properties such as heat resistance, dimensional stability and insulation property are effective, such as a paint, a print ink, a sealing agent, an adhesive or a material for forming displays, semiconductor devices, electronic components, microelectromechanical systems (MEMS), optical elements or building materials. For example, in particular, as the material for forming electronic components, the photosensitive resin composition can be used for a printed wiring board, an interlayer insulating film, a wire cover film or the like as an encapsulating material or as a layer forming material. As the material for forming displays, the photosensitive resin composition can be used for a color filter, a film for flexible displays, a resist material, an orientation film or the like as a layer forming material or as an image forming material. As the material for forming semiconductor devices, it can be used as a resist material, a material for forming layers such as a buffer coat film, or the like. As the material for forming optical components, it can be used for a hologram, an optical, waveguide, an optical circuit, an optical circuit component, an antireflection film or the like as an optical material or a layer forming material. As the building materials, it can be used for a paint, a coating or the like. Also, it can be used as the material for stereolithography products. The photosensitive resin composition of the present invention provides an article selected from a printed product, a paint, a sealing agent, an adhesive, a display, a semiconductor device, an electronic component, a microelectromechanical system, a stereolithography product, an optical element and a building material.

Because of having the above characteristics, the photosensitive resin composition of the present invention can be also used as a pattern forming material. Especially in the case where the photosensitive resin composition containing the polyimide precursor or polybenzoxazole precursor is used as a pattern forming material (resist), the pattern formed therewith is a permanent film that comprises polyimide or polybenzoxazole and functions as a component which imparts heat resistance or insulation property. For example, it is suitable to form a color filter, a film for flexible displays, an electronic component, a semiconductor device, an interlayer insulating film, a wire cover film, an optical circuit, an optical circuit component, an antireflection film, other optical element or an electronic member.

<Pattern Forming Method>

The pattern forming method of the present invention is a method for forming a pattern by forming a coating film or molded body with any of the photosensitive resin compositions of the present invention, exposing the coating film or molded body to electromagnetic radiation in a predetermined pattern, heating the same after or during the exposure to change the solubility of the exposed region, and then developing the coating film or molded body.

A coating film is formed by applying the photosensitive resin composition of the present invention onto some substrate, or a molded body is formed by an appropriate molding method using the photosensitive resin composition. The coating film or molded body is exposed to electromagnetic radiation in a predetermined pattern and heated after or during the exposure, so that the base generator represented by the chemical formula (1) is isomerized and cyclized in the exposed region only, thereby generating a basic substance. The basic substance acts as a catalyst that allows the polymer precursor in the exposed region to react into a final product.

In the case of using a polymer precursor of which thermal curing temperature can be decreased by the catalytic reaction of a base, such as a polyimide precursor and polybenzoxazole precursor, a region where a pattern is required to be left on the coating film or molded body of the photosensitive resin composition is exposed at first, the composition comprising a combination of such a polymer precursor and the base generator represented by the chemical formula (1). By heating the same after or during the exposure, a basic substance is generated in the exposed region and the thermal curing temperature of the region is selectively decreased. After or during the exposure, the coating film or molded body is heated to cure only the exposed region at a treatment temperature at which the exposed region is thermally cured while the unexposed region is not. The heating process for generating a basic substance and another heating process for causing a reaction to cure only the exposed region (post exposure bake) can be one single process or different processes. Next, the unexposed region is dissolved with a predetermined developer such as an organic solvent or basic aqueous solution, thereby forming a pattern comprising a thermally-cured product. This pattern is further heated as needed to finish thermal curing. A desired two-dimensional resin pattern (general plane pattern) or three-dimensional resin pattern (three-dimensionally formed pattern) is obtained by these processes, both of which are normally negative tone.

Even in the case of using a polymer precursor that can initiate a reaction by the catalytic action of a base, such as a compound or polymer having an epoxy or cyanate group, a region where a pattern is required to be left on the coating film or molded body of the photosensitive resin composition is exposed at first, the composition comprising a combination of such a polymer precursor and the base generator represented by the chemical formula (1). By heating the same after or during the exposure, a basic substance is generated in the exposed region and the compound or polymer having an epoxy or cyanate group in the region thus initiates a reaction to cure only the exposed region. The heating process for generating a basic substance and another heating process for causing a reaction to cure only the exposed region (post exposure bake) can be one single process or different processes. Next, the unexposed region is dissolved with a predetermined developer such as an organic solvent or basic aqueous solution, thereby forming a pattern comprising a thermally-cured product. This pattern is further heated as needed to finish thermal curing. A desired two-dimensional resin pattern (general plane pattern) or three-dimensional resin pattern (three-dimensionally formed pattern) is obtained by these processes, both of which is normally negative tone.

The photosensitive resin composition of the present invention gives a non-adhesive coating film on a substrate by dissolving the same in a polar solvent such as N-methyl-dimethylacetamide, N,N-diethylformamide, N,N-diethylacetamide, N,N-dimethylmethoxyacetamide, dimethylsulfoxide, hexamethylphosphoamide, N-acetyl-2- pyrrolidone, pyridine, dimethyl sulfone, tetramethylene sulfone, dimethyltetramethylene sulfone, diethylene glycol dimethyl ether, cyclopentanone, γ-butyrolactone and α-acetyl-γ-butyrolactone, applying the mixture to a surface of a substrate such as a silicon wafer, metal substrate and ceramic substrate by a dipping method, spraying method, screen printing method, spin coating method or the like, and heating the applied coating film to remove most of the solvent in it. The thickness of the coating film is not particularly limited; however, it is preferably 0.5 to 50 µm. From the viewpoint of sensitivity and development rate, it is more preferably 1.0 to 20 µm. The condition of drying the applied coating film is a temperature of 80 to 100° C. for 1 to 20 minutes, for example.

The coating film is exposed to electromagnetic radiation through a mask having a predetermined pattern so as to be exposed in a predetermined pattern. After heating, the film is developed with an appropriate developer to remove the unexposed region of the film, thereby obtaining a desirably patterned film.

The exposing method and device used in the exposure process is not particularly limited. The method can be contact exposure or indirect exposure. As the device, there may be used a contact-proximity exposure system using a g-line stepper, i-line stepper or super high pressure mercury lamp, a mirror projection exposure system, or other projection device or radiation source which can radiate an ultraviolet light, visible light, X-ray, electron beam or the like.

The heating temperature for generating a base after or during the exposure is appropriately determined depending on the polymer precursor to be combined or on the intended purpose, and it is not particularly limited. The heating can be heating at a temperature of the environment where the photosensitive resin composition is placed (e.g., room temperature) and in this case, bases are gradually generated. Bases are also generated by heat that is produced as a by-product of exposure to electromagnetic radiation, so that heating can be performed substantially by the heat produced as the by-product during exposure to electromagnetic radiation. To increase the reaction temperature and thus to efficiently generate an amine, the heating temperature for generating a base is preferably 30° C. or more, more preferably 60° C. or more, still more preferably 100° C. or more, and particularly preferably 120° C. or more. However, the suitable heating temperature is not limited thereto because the unexposed region can be cured by heating at 60° C. or more depending on the type of polymer precursor used in combination.

For example, in the case of an epoxy resin, the preferred temperature range of heat treatment is appropriately determined depending on the type of the epoxy resin; however, it is normally about 100° C. to 150° C.

To physically promote a crosslinking reaction or to cause the reaction for curing only the exposed region, it is preferable to perform a post exposure bake (PEB) on the coating film of the photosensitive resin composition of the present invention between the exposure and developing processes. The PEB is preferably performed at a temperature at which, due to the action of the base generated by the electromagnetic radiation and heating, the reaction rate of the curing reaction (e.g., imidization rate) will be different between regions where the base is present and not present. For example, in the case of imidization, the preferred temperature range of heat treatment is normally about 60° C. to 200° C., more preferably 120° C. to 200° C. When the heat treatment temperature is less than 60° C., imidization is not efficient and it is difficult to cause a difference between the imidization rate of the exposed region and that of the unexposed region under a realistic process condition. When the heat treatment temperature exceeds 200° C., imidization could proceed even in the unexposed region where no amine is present and thus it is difficult to cause a difference between the solubility of the exposed region and that of the unexposed region.

The heat treatment can be performed by any conventionally method. A specific example thereof is, but not particularly limited to, heating with a circulation-type oven or hot plate in air or a nitrogen atmosphere.

In the present invention, a base is generated from the base generator by electromagnetic radiation and heating; however, the heating for generating a base and PEB process can be one single process or different processes.

(Developer)

The developer used in the developing process is not particularly limited as long as it is a solvent which can change the solubility of the exposed region. It can be appropriately selected from basic aqueous solutions, organic solvents and so on, depending on the used polymer precursor.

The basic aqueous solutions are not particularly limited and include, for example, a tetramethylammonium hydroxide (TMAH) aqueous solution in a concentration of 0.01% by weight to 10% by weight (preferably 0.05% by weight to 5% by weight) and aqueous solutions of diethanolamine, diethyl amino ethanol, sodium hydroxide, potassium hydroxide, sodium carbonate, potassium carbonate, sodium hydrogencarbonate, hydrogencarbonate, triethylamine, diethylamine, methylamine, dimethylamine, dimethylamino ethyl acetate, dimethylaminoethanol, dimethylamino ethyl methacrylate, cyclohexylamine, ethylenediamine, hexamethylenediamine, tetramethylammonium and so on.

A solute can be one or more kinds of solutes. The basic aqueous solution can contain an organic solvent or the like when it contains water in an amount of 50% or more, more preferably 70% or more of the total weight thereof.

The organic solvent is not particularly limited. As the organic solvent, polar solvents such as N-methyl-2-pyrrolidone, N,N-dimethylformamide, N,N-dimethylacetamide, dimethylsulfoxide, γ-butyrolactone and dimethylacrylamide, alcohols such as methanol, ethanol and isopropanol, esters such as ethyl acetate and propylene glycol monomethyl ether acetate, ketones such as cyclopentanone, cyclohexanone, isobutyl ketone and methyl isobutyl ketone, and other organic solvents such as tetrahydrofuran, chloroform and acetonitrile, may be used solely or in combination of two or more. After the development, washing is performed with water or a poor solvent. Even in this case, alcohols such as ethanol and isopropyl alcohol, esters such as ethyl lactate and propylene glycol monomethyl ether acetate, etc., can be added to water.

After the development, to stabilize the pattern, rinsing with water or a poor solvent is performed as needed and then drying is performed at a temperature of 80 to 100° C. To make the resulting relief pattern heat resistant, it is heated at a temperature of 180 to 500° C., more preferably 200 to 350° C. for several ten minutes to several hours, thereby forming a patterned, high heat-resistant resin layer.

EXAMPLES

Hereinafter, the present invention will be described in detail by way of examples. The scope of the present invention is not restricted by these examples. All designations of "part" or "parts" are part or parts by weight unless otherwise specifically indicated.

Measurements and experiments were carried out by means of the following devices.

¹H NMR measurement: JEOL JNM-LA400WB manufactured by JEOL Ltd.

Manual exposure: MA-1100 manufactured by Japan Science Engineering Co., Ltd.

Measurement of absorbance: Ultraviolet-visible spectrophotometer UV-2550 manufactured by Shimadzu Corporation Measurement of 5% weight loss temperature: Thermogravimetric/differential thermal analyzer DTG-60 manufactured by Shimadzu Corporation Measurement of infrared absorption spectra: FTS 7000 manufactured by Varian Technologies Japan Ltd.

Heating of coating film: HOT PLATE EC-1200 manufactured by AS ONE Corporation (It may be referred to as "hot plate" in the following examples)

Synthesis Example 1

Synthesis of Polyimide Precursor

Di(4-aminophenyl)ether of 10.0 g (50 mmol) was poured into a 300 mL three-neck flask, dissolved in 105.4 mL of dehydrated N,N-dimethylacetamide (DMAc) and stirred while cooling in an ice bath under a nitrogen flow. 3,3',4,4'-Biphenyltetracarboxylic acid-3, 4:3',4'-dianhydride of 14.7 g (50 mmol) was gradually added thereto and stirred in an ice bath for five hours after the addition. The resulting solution was reprecipitated with dehydrated diethyl ether and the resulting precipitate was dried for 17 hours at a room temperature under a reduced pressure, thereby obtaining a polyamic acid having a weight average molecular weight of 10,000 (polyimide precursor (1)) quantitatively in the form of a white solid.

Synthesis Example 2

Synthesis of Polysiloxane Precursor

Into a 100 ml flask provided with a condenser tube, phenyltriethoxysilane of 5 g, triethoxysilane of 10 g, ammonia water of 0.05 g, water of 5 ml and propylene glycol monomethyl ether acetate of 50 ml were poured. The resulting solution was stirred with a semicircular-type mechanical stirrer and reacted with a heating mantle for six hours at 70° C. Then, ethanol produced by a condensation reaction with water, and residual water were removed with an evaporator. After the reaction was completed, the flask was left to reach room temperature, thereby producing a condensate of alkoxysilane (alkoxysilane condensate (1)).

Production Example 1

Synthesis of Base Generator (1)

In a 300 mL three-neck flask under a nitrogen atmosphere, o-coumaric acid (manufactured by Tokyo Chemical Industry Co., Ltd.) of 1.00 g (6.1 mmol) was dissolved in dehydrated tetrahydrofuran of 100 mL, and 1-ethyl-3-(3-dimethylaminopropyl) carbodiimide hydrochloride (manufactured by Tokyo Chemical Industry Co., Ltd.) of 1.17 g (6.1 mmol, 1.0 eq) was added thereto. Cyclohexylamine (manufactured by Kanto Chemical Co., Inc.) of 0.7 ml (6.1 mmol, 1.0 eq) was added thereto in an ice bath, and then the mixture was stirred at room temperature for three days. The resulting reaction solution was washed with a saline solution and dried with sodium sulfate. The resultant was purified by silica-gel column chromatography (developing solvent: chloroform/methanol=1/0 to 20/1), thereby obtaining base generator (1) represented by the following chemical formula (6) of 350 mg.

[Chemical formula 10]

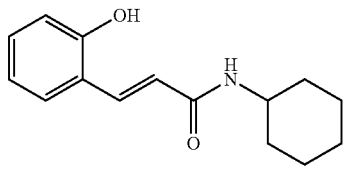

Formula (6)

Production Example 2

Synthesis of Base Generator (2)

In a 100 mL flask, potassium carbonate of 2.00 g was added to methanol of 15 mL. In a 50 mL flask, ethoxycarbonylmethyl (triphenyl)phosphonium bromide (manufactured by Tokyo Chemical Industry Co., Ltd.) of 4.29 (10 mmol) and 2-hydroxy-4-methoxybenzaldehyde (manufactured by Tokyo Chemical Industry Co., Ltd.) of 1.52 g (10 mmol) were dissolved in methanol of 10 mL and gradually added dropwise to the potassium carbonate solution stirred well. After the mixture was stirred for three hours, reaction completion was confirmed by thin-layer chromatography, and then the potassium carbonate was removed by filtration. The resultant was subjected to vacuum concentration. After the concentration, a 1 N sodium hydroxide aqueous solution of 50 mL was added thereto and stirred for one hour. After reaction completion, precipitates were removed by filtration and concentrated hydrochloric acid was added dropwise to the resulting reaction solution to make the solution an acidic solution. The thus-obtained precipitate was collected by filtration and washed with a small amount of chloroform, thereby obtaining 2-hydroxy-4-methoxycinnamic acid of 1.46 g (7.52 mmol).

In a 300 mL three-neck flask under a nitrogen atmosphere, the 2-hydroxy-4-methoxycinnamic acid of 1.01 g (5.2 mmol) was dissolved in dehydrated tetrahydrofuran of 40 mL, and 1-ethyl-3-(3-dimethylaminopropyl) carbodiimide hydrochloride (manufactured by Tokyo Chemical Industry Co., Ltd.) of 0.99 g (5.2 mmol) was added thereto in an ice bath. Thirty minutes later, 1-hydroxybenzotriazole (manufactured by Tokyo Chemical Industry Co., Ltd.) of 0.79 g (5.2 mmol) was gradually added dropwise. After the mixture was left to room temperature and stirred for about 30 minutes, cyclohexylamine (manufactured by Kanto Chemical Co., Inc.) of 0.5 ml (4.2 mmol) was added thereto. Ten minutes later, 4-(dimethylamino)pyridine of 0.10 g (0.86 mmol) was added thereto and then the mixture was stirred overnight. After reaction completion, the resulting reaction solution was condensed and dissolved in water. After extraction with ethyl acetate, the resultant was washed with a hydrogen carbonate aqueous solution, 1 N hydrochloric acid and then saturated saline, and dried with sodium sulfate. The resultant was purified by silica-gel column chromatography (developing solvent: chloroform/methanol=100/1 to 10/1), thereby obtaining base generator (2) represented by the following chemical formula (7) of 350 mg.

[Chemical formula 11]

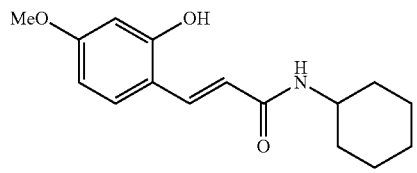

Formula (7)

Production Example 3

Synthesis of Base Generator (3)

In a 100 mL three-neck flask under a nitrogen atmosphere, o-coumaric acid (manufactured by Tokyo Chemical Industry Co., Ltd.) of 0.50 g (3.1 mmol) was dissolved in dehydrated tetrahydrofuran of 40 mL, and 1-ethyl-3-(3-dimethylaminopropyl) carbodiimide hydrochloride (manufactured by Tokyo Chemical Industry Co., Ltd.) of 0.59 g (3.1 mmol, 1.0 eq) was added thereto. Piperidine (manufactured by Tokyo Chemical Industry Co., Ltd.) of 0.3 ml (3.1 mmol, 1.0 eq) was added thereto in an ice bath, and the mixture was stirred at room temperature for one night. The resulting reaction solution was condensed, extracted with chloroform, washed with a dilute hydrochloric acid, saturated sodium hydrogen carbonate aqueous solution and then saline solution, followed by filtration, thereby obtaining base generator (3) represented by the following chemical formula (8) of 450 mg.

[Chemical formula 12]

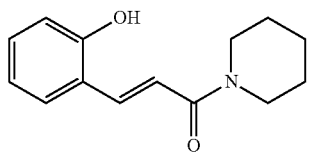

Formula (8)

Production Example 4

Synthesis of Base Generator (4)

In a 100 mL three-neck flask under a nitrogen atmosphere, o-coumaric acid (manufactured by Tokyo Chemical Industry Co., Ltd.) of 1.00 g (6.1 mmol) was dissolved in dehydrated tetrahydrofuran of 40 mL, and 1-ethyl-3-(3-dimethylaminopropyl) carbodiimide hydrochloride (manufactured by Tokyo Chemical Industry Co., Ltd.) of 1.4 g (7.3 mmol, 1.2 eq) was added thereto. Dipropylamine (manufactured by Tokyo Chemical Industry Co., Ltd.) of 1.0 ml (7.3 mmol, 1.2 eq) was added thereto in an ice bath, and the mixture was stirred at room temperature for one night. The resulting reaction solution was condensed, extracted with chloroform, washed with a dilute hydrochloric acid, saturated sodium hydrogen carbonate aqueous solution and then saline solution, followed by filtration, thereby obtaining base generator (4) represented by the following chemical formula (9) of 171 mg.

[Chemical formula 13]

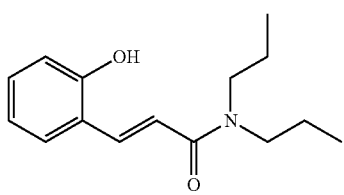

Formula (9)

Production Example 5

Synthesis of Base Generator (5)

Base generator (5) represented by the following chemical formula (10) of 360 mg was obtained in the same manner as in Production example 4 except that pyrrolidine (manufactured by Tokyo Chemical Industry Co., Ltd.) of 0.6 ml (7.3 mmol, 1.2 eq) was used in place of dipropylamine (manufactured by Tokyo Chemical Industry Co., Ltd.) of 1.0 ml (7.3 mmol, 1.2 eq).

[Chemical formula 14]

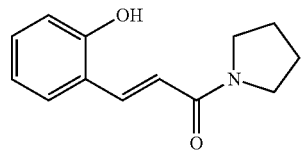

Formula (10)

Production Example 6

Synthesis of Base Generator (6)

Base generator (6) represented by the following chemical formula (11) of 379 mg was obtained in the same manner as in Production example 4 except that hexamethyleneimine (manufactured by Tokyo Chemical Industry Co., Ltd.) of 0.82 ml (7.3 mmol, 1.2 eq) was used in place of dipropylamine (manufactured by Tokyo Chemical Industry Co., Ltd.) of 1.0 ml (7.3 mmol, 1.2 eq).

[Chemical formula 15]

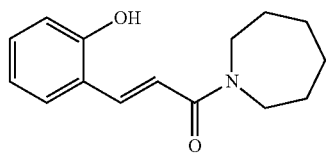

Formula (11)

Production Example 7

Synthesis of Base Generator (7)

Base generator (7) represented by the following chemical formula (12) of 498 mg was obtained in the same manner as in Production example 4 except that diethylamine (manufactured by Tokyo Chemical Industry Co., Ltd.) of 1.0 ml (7.3 mmol, 1.2 eq) was used in place of dipropylamine (manufactured by Tokyo Chemical Industry Co., Ltd.) of 1.0 ml (7.3 mmol, 1.2 eq).

[Chemical formula 16]

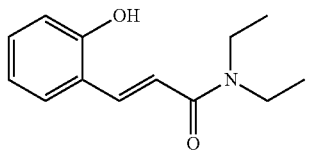

Formula (12)

Production Example 8

Synthesis of Base Generator (8)

In a 100 mL flask, 2-hydroxy-cinnamic acid of 500 mg (3.0 mmol) was dissolved in dioxane of 20 ml, and thionyl chloride of 200 μl (2.8 mmol, 0.9 eq) was gradually added thereto. After the mixture was stirred for 10 minutes, 2,6-dimethylpiperidine of 0.9 ml (6.6 mmol, 2.2 eq) was added thereto. After reaction completion, the resulting reaction solution was condensed and dissolved in water. After extraction with chloroform, the resultant was washed with a saturated sodium hydrogen carbonate aqueous solution, 1 N hydrochloric acid and then saturated saline, followed by filtration, thereby obtaining base generator (8) represented by the following chemical formula (13) of 64 mg.

[Chemical formula 17]

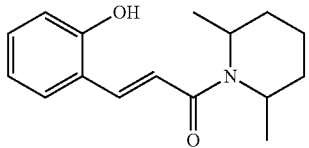

Formula (13)

Production Example 9

Synthesis of Base Generator (9)

In a 100 mL flask, potassium carbonate of 2.00 g was added to methanol of 15 mL. In a 50 mL flask, ethoxycarbonylmethyl (triphenyl)phosphonium bromide of 2.67 g (6.2 mmol) and 2-hydroxy-4-methoxybenzaldehyde of 945 mg (6.2 mmol) were dissolved in methanol of 10 mL and gradually added dropwise to the potassium carbonate solution stirred well. After the mixture was stirred for three hours, reaction completion was confirmed by TLC, and then the potassium carbonate was removed by filtration. The resultant was subjected to vacuum concentration. After the concentration, a 1N sodium hydroxide aqueous solution of 50 mL was added thereto and stirred for one hour. After reaction completion, triphenylphosphine oxide was removed by filtration and concentrated hydrochloric acid was added dropwise to the resulting reaction solution to make the solution an acidic solution. The thus-obtained precipitate was collected by filtration and washed with a small amount of chloroform, thereby obtaining 2-hydroxy-4-methoxycinnamic acid of 1.00 g. Then, in a 100 mL three-neck flask, the 2-hydroxy-4-methoxycinnamic acid of 500 mg (3.0 mmol) was dissolved in dehydrated tetrahydrofuran of mL, and 1-ethyl-3-(3-dimethylaminopropyl) carbodiimide hydrochloride (EDC) of 0.586 g (3.0 mmol) was added thereto. Thirty minutes later, piperidine of 0.3 ml (3.0 mmol) was added thereto. After reaction completion, the resulting reaction solution was condensed and dissolved in water. After extraction with diethyl ether, the resultant was washed with a saturated sodium hydrogen carbonate aqueous solution, 1 N hydrochloric acid and then saturated saline. Then, the resultant was purified by silica-gel column chromatography (developing solvent: chloroform/methanol=100/1 to 10/1), thereby obtaining base generator (9) represented by the following chemical formula (14) of 64 mg.

[Chemical formula 18]

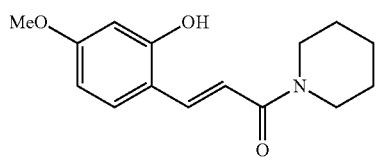

Formula (14)

Production Example 10

Synthesis of Base Generator (10)

Instead of 2-hydroxy-4-methoxycinnamic acid in Production example 9, 3,5-di-tert-butyl-2-hydroxycinnamic acid of 1.20 g was obtained in the same manner as in Production example 9 except that 3,5-di-tert-butylsalicylaldehyde of 1.45 g (6.2 mmol) was used in place of 2-hydroxy-4-methoxybenzaldehyde of 945 mg (6.2 mmol). Then, in a 100 mL three-neck flask, the 3,5-di-tert-butyl-2-hydroxycinnamic acid of 500 mg (1.8 mmol) was dissolved in dehydrated tetrahydrofuran of 20 mL, and EDC of 0.416 g (2.2 mmol) was added thereto. Thirty minutes later, piperidine of 0.21 mL (2.2 mmol) was added thereto and the mixture was stirred at room temperature for one night. The resulting reaction solution was condensed, extracted with chloroform, washed with a dilute hydrochloric acid, saturated sodium hydrogen carbonate aqueous solution and then saline solution, followed by filtration, thereby obtaining base generator (10) represented by the following chemical formula (15) of 320 mg.

[Chemical formula 19]

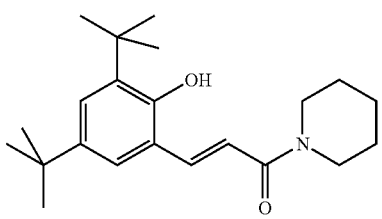

Formula (15)

Production Example 11

Synthesis of Base Generator (11)

Instead of 2-hydroxy-4-methoxycinnamic acid in Production example 9,3-(2-hydroxy-1-naphthalenyl)-acrylic acid of 1.20 g was obtained in the same manner as in Production example 9 except that 2-hydroxy-1-naphthaldehyde of 1.07 g (6.2 mmol) was used in place of 2-hydroxy-4-methoxybenzaldehyde of 945 mg (6.2 mmol). Then, in a 100 mL three-neck flask, the 3-(2-hydroxy-1-naphthalenyl)-acrylic acid of 1.00 g (4.67 mmol) was dissolved in dehydrated tetrahydrofuran of 20 mL, and EDC of 1.07 g (5.60 mmol) was added thereto. Thirty minutes later, cyclohexylamine of 0.64 mL (5.60 mmol) was added thereto and the mixture was stirred at room temperature for one night. The resulting reaction solution was condensed, extracted with chloroform, washed with a dilute hydrochloric acid, saturated sodium hydrogen carbonate aqueous solution and then saline solution, followed by filtration, thereby obtaining base generator (11) represented by the following chemical formula (16) of 520 mg.

[Chemical formula 20]

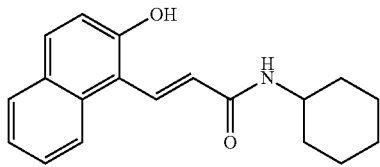

Formula (16)

Production Example 12

Synthesis of Base Generator (12)

In the same manner as in Production example 11, 3-(2-hydroxy-1-naphthalenyl)-acrylic acid of 1.20 g was obtained. Then, base generator (12) represented by the following chemical formula (17) of 480 mg was obtained in the same manner as in Production example 11 except that piperidine of 0.65 ml (5.60 mmol) was used in place of cyclohexylamine of 0.64 mL (5.60 mmol).

[Chemical formula 21]

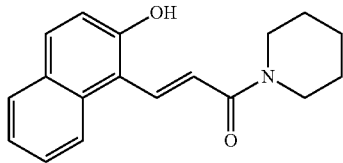

Formula (17)

Production Example 13

Synthesis of Base Generator (13)

In the same manner as in Production example 11, 3-(2-hydroxy-1-naphthalenyl)-acrylic acid of 1.20 g was obtained. Then, base generator (13) represented by the following chemical formula (18) of 620 mg was obtained in the same manner as in Production example 11 except that dipropylamine of 0.92 ml (5.60 mmol) was used in place of cyclohexylamine of 0.64 mL (5.60 mmol).

[Chemical formula 22]

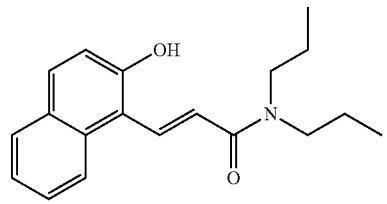

Formula (18)

Production Example 14

Synthesis of Base Generator (14)

Base generator (14) represented by the following chemical formula (19) of 1.088 g was obtained in the same manner as in Production example 4 except that imidazole (manufactured by Tokyo Chemical Industry Co., Ltd.) of 0.37 ml (5.5 mmol, 0.9 eq) was used in place of dipropylamine (manufactured by Tokyo Chemical Industry Co., Ltd.) of 1.0 ml (7.3 mmol, 1.2 eq).

[Chemical formula 23]

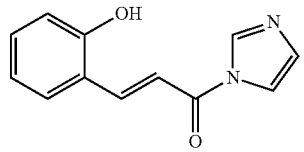

Formula (19)

Production Example 15

Synthesis of Base Generator (15)

In a 200 mL flask, potassium carbonate of 10.0 g was added to methanol of 75 mL. In a 100 mL flask, ethoxycarbonylmethyl (triphenyl)phosphonium bromide (manufactured by Tokyo Chemical Industry Co., Ltd.) of 21.5 g (50 mmol) and 2,4-dihydroxybenzaldehyde (manufactured by Tokyo Chemical Industry Co., Ltd.) of 6.9 g (50 mmol) were dissolved in methanol of 50 mL and gradually added dropwise to the potassium carbonate solution stirred well. After the mixture was stirred for three hours, reaction completion was confirmed by thin-layer chromatography (TLC). The resulting reaction solution was filtered to remove the potassium carbonate and subjected to vacuum concentration. After the concentration, a 1 N sodium hydroxide aqueous solution of 50 mL was added thereto and stirred for 12 hours. After reaction completion, triphenylphosphine oxide was removed by filtration. Then, concentrated hydrochloric acid was added dropwise to the resulting reaction solution to make the solution an acidic solution; therefore, a precipitate was produced. The precipitate was collected by filtration and washed with a small amount of chloroform, thereby obtaining 2,4-dihydroxycinnamic acid of 3.8 g.

Then, in a 100 mL three-neck flask, the 2,4-dihydroxycinnamic acid of 500 mg (2.78 mmol) was dissolved in tetrahydrofuran of 10 mL, and 1-ethyl-3-(3-dimethylaminopropyl)carbodiimide hydrochloride (manufactured by Tokyo Chemical Industry Co., Ltd.) of 0.64 g (3.33 mmol) was added thereto. Thirty minutes later, cyclohexylamine (manufactured by Tokyo Chemical Industry Co., Ltd.) of 0.32 mL (3.33 mmol) was added thereto. After reaction completion, the resultant was dissolved in water. After extraction with chloroform, the resultant was washed with a saturated sodium hydrogen carbonate aqueous solution, 1 N hydrochloric acid and then saturated saline. Then, the resultant was purified by silica-gel column chromatography (developing solvent: chloroform/methanol=100/1 to 10/1), thereby obtaining base generator (15) represented by the following chemical formula (20) of 203 mg.

[Chemical formula 24]

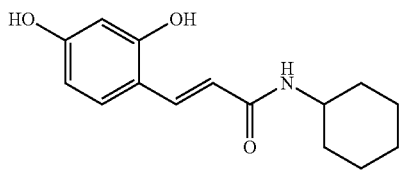

Formula (20)

Production Example 16

Synthesis of Base Generator (16)

Base generator (16) represented by the following chemical formula (21) of 360 mg was obtained in the same manner as in Production example 15 except that piperidine (manufactured by Tokyo Chemical Industry Co., Ltd.) of 0.32 mL (3.33 mmol, 1.2 eq) was used in place of cyclohexylamine (manufactured by Tokyo Chemical Industry Co., Ltd.) of 0.32 mL (3.33 mmol, 1.2 eq).

[Chemical formula 25]

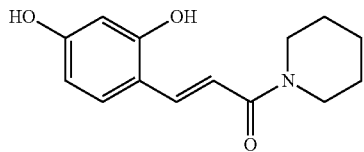

Formula (21)

Comparative Production Example 1

Synthesis of Comparative Base Generator (1)

In accordance with the description of JP-A No. 2006-189591, [(4,5-dimethoxy-2-nitrobenzyl)oxy]carbonyl-2,6-dimethylpiperidine (hereinafter may be referred to as "DNCDP") represented by the following chemical formula (22) was synthesized as comparative base generator (1) by the method described in Macromolecules, A. Mochizuki, Vol. 28, No. 1, 1995.

[Chemical formula 26]

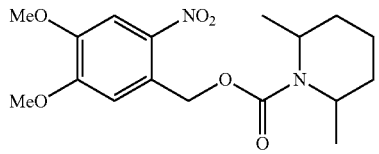

Formula (22)

<Evaluation of Base Generators>

The thus-synthesized base generators (1) to (16) and comparative base generator (1) were subjected to the following measurements for evaluation. Results of molar absorbance coefficient measurement and 5% weight loss temperature measurement are shown in Table 1. Results of measurement of base-generating ability are shown in Table 2. In Table 2, base generation rate is a percentage of the molar number of the generated bases relative to the molar number of the used base generator, and the base generation rates of base generators (1) to (16) are each a base generation rate of bases generated by exposure to light and by heating.

(1) Molar Absorbance Coefficient

Each of base generators (1) to (16) and comparative base generator (1) was dissolved in acetonitrile to have a concentration of $1 \times 10^{-4}$ mol/L and the resulting solution was poured into a quartz cell (optical path 10 mm) to measure the absorbance.

(2) 5% Weight Loss Temperature

To evaluate heat resistance, each of base generators (1) to (16) and comparative base generator (1) was measured for 5% weight loss temperature in the condition of a sample weight of 3.4 mg and a heating rate of 10° C./min.

TABLE 1

| | Molar absorbance coefficient (ε) | | 5% weight loss temperature |
|---|---|---|---|
| | 365 nm | 405 nm | (° C.) |
| Base generator 1 | 30 | 0 | 199 |
| Base generator 2 | 126 | 39 | 205 |
| Base generator 3 | 110 | 0 | 198 |
| Base generator 4 | 20 | 0 | 219 |
| Base generator 5 | 40 | 20 | 224 |
| Base generator 6 | 60 | 20 | 223 |
| Base generator 7 | 10 | 10 | 206 |
| Base generator 8 | 130 | 50 | 209 |
| Base generator 9 | 260 | 40 | 199 |
| Base generator 10 | 553 | 10 | 199 |
| Base generator 11 | 3,760 | 20 | 182 |
| Base generator 12 | 5,332 | 0 | 195 |
| Base generator 13 | 5,113 | 48 | 181 |
| Base generator 14 | 5,860 | 30 | 126 |
| Base generator 15 | 520 | 20 | 187 |
| Base generator 16 | 504 | 0 | 185 |
| Comparative base generator 1 | 4,820 | 290 | 238 |

(3) Base-Generating Ability

A set of three 1-mg samples were taken from each of base generators (1) to (16). Each of the samples was dissolved in dimethyl-d6 sulfoxide in a quartz NMR tube. Among the three samples of each base generator, using a filter that transmits 20% of i-line and a high-pressure mercury lamp, the first sample was exposed to light at 2 J/cm$^2$ and the second sample was exposed to light at 20 J/cm$^2$. The third sample was not exposed to light. The three samples were measured for $^1$H NMR to determine the isomerization rate of each.

In the case of base generator (1), 5.1% of the same was isomerized when exposed to light at 2 J/cm$^2$ while 34.0% was isomerized when exposed to light at 20 J/cm². When each of the isomerized samples was heated to 160° C., 98% of the isomerized compounds were cyclized, thereby generating bases and resulting in the base generation rate shown in Table 2. Base generation rates of base generators (2) to (16) were obtained in the same manner. The results are shown in Table 2. Base generators (12) and (13) had high ability to generate a base, so that they were exposed to light at 6 J/cm², instead of 20 J/cm².

In the case of comparative base generator (1), no base generation was observed when exposed to light at 2 J/cm². When exposed to light at 20 J/cm², a base of 4.8% was generated.

It is clear from the above results that although base generators (1) to (16) of the present invention have lower molar absorbance coefficients than comparative base generator (1), they can efficiently generate a base. Especially, base generator (9) in which a methoxy group is introduced into a cinnamic acid derivative site was found to be highly sensitive and able to efficiently generate a base. Also, base generator (14) to which imidazole is bound was found to be isomerized with significant sensitivity. However, base generator (14) is characterized by having lower heat resistance than other base generators, so that it is suited to be used together with a compound having an epoxy group or a compound having an isocyanate group, both of which having a low drying temperature or post-exposure bake temperature.

TABLE 2

| | Electromagnetic radiation [J/cm²] | | |
|---|---|---|---|
| | 0 | 2 | 20 |
| Base generator 1 | 0 | 5.1 | 33.3 |
| Base generator 2 | 0 | 6.5 | 32.9 |
| Base generator 3 | 0 | 5.9 | 22.5 |
| Base generator 4 | 0 | 1.0 | 27.5 |
| Base generator 5 | 0 | 2.0 | 17.4 |
| Base generator 6 | 0 | 1.0 | 12.3 |
| Base generator 7 | 0 | 5.7 | 23.0 |
| Base generator 8 | 0 | 2.0 | 16.0 |
| Base generator 9 | 0 | 23.0 | 90.5 |
| Base generator 10 | 0 | 2.0 | 33.8 |
| Base generator 11 | 0 | 16.0 | 65.6 |
| Base generator 12 | 0 | 50.5 | 95.0 (6 J/cm²) |
| Base generator 13 | 0 | 23.7 | 52.4 (6 J/cm²) |
| Base generator 14 | 0 | 48.7 | 100 |
| Base generator 15 | 0 | 4.8 | 50.5 |
| Base generator 16 | 0 | 24.8 | 93.6 |
| Comparative base generator 1 | 0 | 0 | 4.8 |

Example 1

Production of Photosensitive Resin Composition (1)

Photosensitive resin composition (1) of the following composition was produced.
Polyimide precursor (1): 8 parts by weight
Base generator (1): 2 parts by weight
Solvent (dimethylacetamide): 90 parts by weight
(Production of Coating Film)
Photosensitive resin composition (1) was spin-coated on chrome-plated glass plates so that the final thickness becomes 1 μm, and was dried on a hot plate at 100° C. for five minutes to obtain three coating films. The first coating film was subjected to whole surface exposure at 2 J/cm² in i-line equivalent, while the second coating film was exposed to light in a predetermined pattern at 10 J/cm² in i-line equivalent. The third coating film was not exposed to light.

Example 2

Production of Photosensitive Resin Composition (2)

Photosensitive resin composition (2) of the following composition was produced using base generator (3).
Polyimide precursor (1): 85 parts by weight
Base generator (3): 15 parts by weight
Solvent (N-methyl-2-pyrrolidone): 733 parts by weight Example 3

Production of Photosensitive Resin Composition (3)

Photosensitive resin composition (3) was produced in the same manner as in Example 2 except that base generator (9) was used in place of base generator (3).

Example 4

Production of Photosensitive Resin Composition (4)

Photosensitive resin composition (4) was produced in the same manner as in Example 2 except that base generator (16) was used in place of base generator (3).

Comparative Example 1

Production of Comparative Photosensitive Resin Composition (1)

Comparative photosensitive resin composition (1) was produced in the same manner as in Example 2 except that comparative base generator (1) was used in place of base generator (3).
(Production of Coating Film)
Each of photosensitive resin compositions (2), (3) and (4) and comparative photosensitive resin composition (1) was spin-coated on chrome-plated glass plates so that the final thickness becomes 4 μm, and was dried on a hot plate at 80° C. for 15 minutes to obtain five coating films of photosensitive resin composition (2), eight coating films of each of photosensitive resin compositions (3) and (4), and six coating films of comparative photosensitive resin composition (1). In each case, all the coating films except one were subjected to whole surface exposure by means of a manual exposure device and a high pressure mercury lamp. Four of the coating films of photosensitive resin composition (2) were subjected to whole surface exposure at 0, 500, 700 and 4,000 mJ/cm², respectively. Seven of the coating films of each of photosensitive resin compositions (3) and (4) were subjected to whole surface exposure at 0, 10, 30, 50, 100, 300 and 1,000 mJ/cm², respectively. Five of the coating films of comparative photosensitive resin composition (1) was subjected to whole surface exposure at 0, 500, 1,000, 2,000 and 4,000 mJ/cm², respectively. In each case, the remaining one coating film was exposed to light in a predetermined pattern. Thereafter, all of the coating films were heated at 155° C. for 10 minutes.
<Evaluation of Photosensitive Resin Compositions>
(1) Thermal Curing Temperature
The exposed and unexposed coating films produced by using photosensitive resin composition (1) were measured for infrared absorption spectra while they were heated from room temperature to 350° C. at 5° C./min. FIG. 1 shows a result of plotting the amount of peak strength decrease due to heating, which was plotted to confirm the progress of imidization based on precursor-derived peak strength at 1,605 cm$^{-1}$ before measurement.

It is clear from FIG. 1 that imidization rate difference between the exposed samples and unexposed samples is greatest at a temperature of around 160° C. With the heating, polyimide precursor-derived spectra disappeared and polyimide-derived peaks appeared. From this fact, it was confirmed that the polyimide precursor was reacted into a polyimide.

(2) Remaining Thickness Ratio

Figure 2:
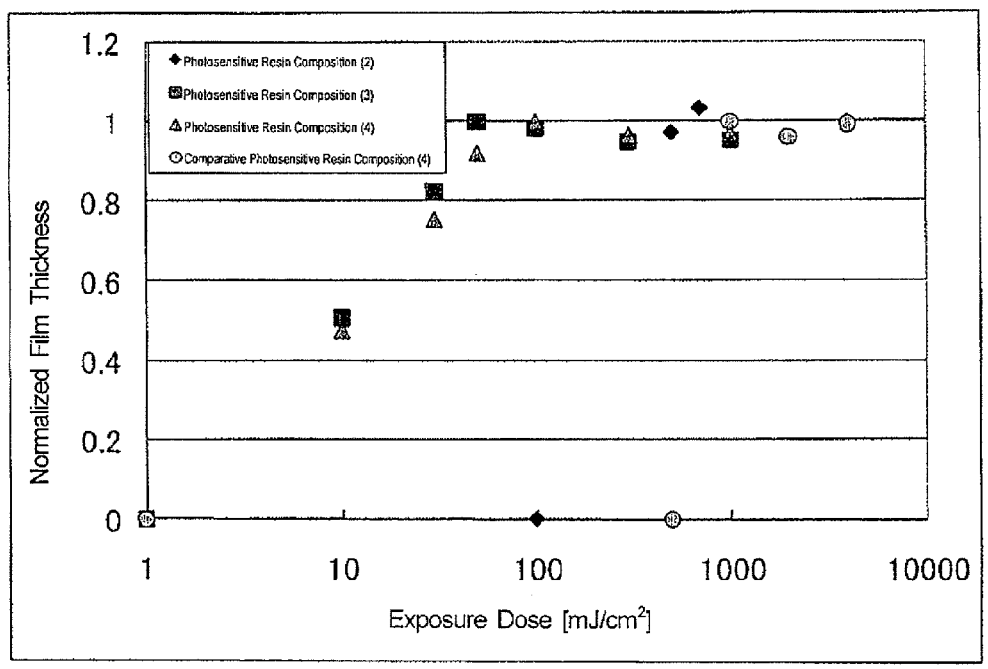
FIG. 2 is a graph showing the relationship between exposure dose and remaining thickness ratio, the graph being formed by using photosensitive resin compositions (2), (3) and (4) and comparative photosensitive resin composition (1).

Each of the coating films produced by using photosensitive resin compositions (2), (3) and (4) and comparative photosensitive resin composition (1) and subjected to whole surface exposure, was dipped in a solution at room temperature for 10 minutes and measured for remaining film thickness on the glass plate, the solution being prepared by mixing an aqueous solution that contains tetramethylammonium hydroxide of 2.38% by weight with isopropanol at a ratio of 9:1. The results are shown in FIG. 2. Normalized film thickness in FIG. 2 is a value that was calculated using the following equation: coating film thickness after development×100/maximum coating film thickness after development.

The remaining thickness ratios were increased as UV exposure dose increased. This fact shows that an amine was generated from the base generator by exposure to UV radiation and heating, and imidization was developed. Photosensitive resin compositions (3) and (4) had a normalized film thickness of about 1 at 50 mJ/cm$^2$ and photosensitive resin composition (2) of the present invention had a normalized film thickness of about 1 at 500 mJ/cm$^2$. On the other hand, comparative photosensitive resin composition (1) had a remaining thickness ratio of 0 at 500 mJ/cm$^2$ and a normalized film thickness of about 1 at 1,000 mJ/cm$^2$. The remaining thickness ratios were increased as UV exposure dose increased. This fact shows that a base was generated from the base generator by exposure to UV radiation and heating, and imidization was developed. From these results, it is clear that the photosensitive resin composition of the present invention is imidized at a smaller exposure dose and thus is more sensitive than the comparative photosensitive resin composition. It is also clear that photosensitive resin compositions (3) and (4) are imidized at an especially small exposure dose.

(3) Pattern Forming Ability

The coating film which was produced by using photosensitive resin composition (1) and exposed to light in a predetermined pattern, was heated on a hot plate at 170° C. for five minutes. Then, it was dipped in a solution prepared by mixing a 2.38 wt % tetramethylammonium hydroxide aqueous solution with isopropanol at a ratio of 9:1. A pattern was obtained therefore, comprising an exposed region that was not dissolved in the developer and thus remained. Then, it was heated at 350° C. for one hour for imidization. From this result, it is clear that the photosensitive resin composition of the present invention can form an excellent pattern.

The coating films which were produced by using photosensitive resin compositions (2), (3) and (4) and exposed to light in a predetermined pattern, were dipped in a solution prepared by mixing a 2.38 wt % tetramethylammonium hydroxide aqueous solution with isopropanol at a ratio of 9:1. Patterns were obtained therefore, each of which comprises an exposed region that was not dissolved in a developer and thus remained. Then, they were heated at 350° C. for one hour for imidization. From this result, it is clear that the photosensitive resin compositions of the present invention can form an excellent pattern. Photosensitive resin composition (2) of the present invention formed a pattern at 500 mJ/cm$^2$ and photosensitive resin compositions (3) and (4) formed a pattern at 100 mJ/cm$^2$ each. On the other hand, after conducting the same experiment, comparative photosensitive resin composition (1) finally formed a pattern at 2,000 mJ/cm$^2$.

Example 5 and 6

Production of Photosensitive Resin Compositions (5) and (6)

Photosensitive resin compositions (5) and (6) of the following compositions were produced by using base generators (5) or (7), respectively.

Epoxy resin (jER828 manufactured by Japan Epoxy Resins Co., Ltd.): 15 parts by weight
Base generators (5) or (7): 15 parts by weight
Solvent (N-methyl-2-pyrrolidone): 370 parts by weight A pair of test tubes was prepared, which was filled with 500 mg of photosensitive resin composition (5), while another pair of test tubes was filled with 500 mg of photosensitive resin composition (6). Using a manual exposure device, one of the first pair and one of the second pair were exposed to light at 100 J/cm$^2$ in i-line equivalent. All the four test tubes were heated at 160° C. for 30 minutes. NMR measurement was performed on the heated samples; therefore, in both cases of photosensitive resin compositions (5) and (6), formation of new peaks was confirmed in the exposed sample, while no formation of new peaks was confirmed in the unexposed sample.

Each of photosensitive resin compositions (5) and (6) was spin-coated on a chrome-plated glass plate so that the final thickness becomes 0.5 μm, and was dried on a hot plate at 80° C. for 15 minutes to obtain two coating films for each photosensitive resin composition. One of the two coating films of each photosensitive resin composition was subjected to whole surface exposure at 10 J/cm$^2$ by means of a manual exposure device and a high pressure mercury lamp. Then, all of the coating films were heated at 160° C. for 30 minutes. The heated coating films were dipped in a mixed solution of isopropanol and chloroform (isopropanol:chloroform=4:1 (volume ratio)) at room temperature for 10 minutes. As a result, it was found that the two coating films exposed and then heated were not dissolved in the mixed solution, and the epoxy resin was cured in both films. On the other hand, the two coating films heated but not exposed were dissolved in the mixed solution.

Example 7

Production of Photosensitive Resin Composition (7)

Photosensitive resin composition (7) was produced, comprising hexamethylene diisocyanate (manufactured by Kanto Chemical Co., Inc.) of 100 parts by weight as an isocyanato resin, polytetrahydrofuran (manufactured by Aldrich) of 150 parts by weight as a resin having a hydroxyl group, base generator (3) of 10 parts by weight and tetrahydrofuran of 500 parts by weight.

Photosensitive resin composition (7) was spin-coated on a chrome-plated glass plate so that the final thickness becomes 0.5 μm, and was dried on a hot plate at 60° C. for five minutes to obtain a coating film of the photosensitive resin composition. The thus-obtained coating film was subjected to whole surface exposure at 1 J/cm$^2$ by means of a manual exposure device and a high pressure mercury lamp. Then, the film was heated at 120° C. for 10 minutes and cooled to room temperature. As a result, a low elastic solid was obtained, and it was confirmed that curing of the isocyanato and hydroxyl groups was promoted.

Example 8

Production of Photosensitive Resin Composition (8)

Photosensitive resin composition (8) was produced by mixing alkoxysilane condensate (1) of 100 parts by weight with base generator (3) of 10 parts by weight and then dissolving the mixture in tetrahydrofuran of 500 parts by weight that is a solvent.

Photosensitive resin composition (8) was spin-coated on a chrome-plated glass plate so that the final thickness becomes 0.5 μm, and was dried on a hot plate at 80° C. for five minutes to obtain two coating films of the photosensitive resin composition. One of the coating films of the photosensitive resin composition was subjected to whole surface exposure at 10 J/cm² by means of a manual exposure device and a high pressure mercury lamp. Then, the exposed and unexposed coating films were heated at 120° C. for 30 minutes. Infrared absorption spectral measurement was performed on the samples before and after the heating. As a result, the heated sample of the exposed coating film showed a peak at 1,020 cm$^{-1}$ which is attributed to Si—O—Si bonds that indicate polymerization. In addition, it showed reduction of peaks at 2,850 cm$^{-1}$ and 850 cm$^{-1}$ which are attributed to Si—OCH$_3$ that refers to raw materials as compared to those of the same before the heating. The heated sample of the unexposed coating film also showed a peak at 1,020 cm$^{-1}$ which is attributed to a Si—O—Si bond that indicates polymerization. The peak was smaller than the exposed coating film, however. From these results, it is clear that when exposed to light, the base generator of the present invention generates a base and thus promotes polymerization of the alkoxysilane condensate.

The invention claimed is:

1. A base generator which is represented by the following chemical formula (1) and generates a base by exposure to electromagnetic radiation and heating:

[Chemical formula 1]

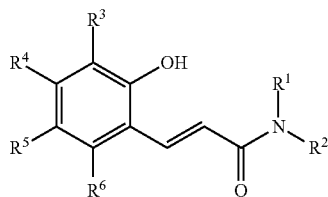

Formula (1)

wherein $R^1$ and $R^2$ are a combination of hydrogen and a saturated or unsaturated cycloalkyl group or independently a monovalent organic group, and $R^1$ and $R^2$ may be bound to form a cyclic structure which may contain a heteroatom; $R^3$, $R^4$, $R^5$ and $R^6$ are independently hydrogen, halogen, a hydroxyl group, a nitro group, a nitroso group, a mercapto group, a silyl group, a silanol group or a monovalent organic group and may be the same or different; two or more of $R^3$, $R^4$, $R^5$ and $R^6$ may be bound to form a cyclic structure which may contain a heteroatom; at least one of $R^3$, $R^4$, $R^5$ and $R^6$ is halogen, a hydroxyl group, a nitro group, a nitroso group, a mercapto group, a silyl group, a silanol group or a monovalent organic group, or two or more of $R^3$, $R^4$, $R^5$ and $R^6$ are bound to form a condensed ring together with a benzene ring to which $R^3$, $R^4$, $R^5$ and $R^6$ are bound.

2. The base generator according to claim 1, wherein a base thus generated is a secondary amine which has one NH group that is able to form an amide bond and/or a heterocyclic compound.

3. The base generator according to claim 1, wherein the base thus generated has a boiling point of 25° C. or more and a weight loss of 80% or more at 350° C.

4. The base generator according to claim 1, wherein the base thus generated has a structure represented by the following formula (2):

[Chemical formula 2]

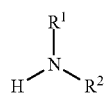

Formula (2)

wherein $R^1$ and $R^2$ are independently a monovalent organic group which is an alkyl group that has 1 to 10 carbon atoms and that may have a substituent, or a cycloalkyl group that has 4 to 12 carbon atoms and that may have a substituent; $R^1$ and $R^2$ may be the same or different; and $R^1$ and $R^2$ may be bound to form a cyclic structure which may contain a heteroatom.

5. The base generator according to claim 1, having absorption at at least one of electromagnetic wavelengths of 365 nm, 405 nm and 436 nm.

* * * * *